United States Patent [19]

Morris

[11] Patent Number: 5,430,008
[45] Date of Patent: Jul. 4, 1995

[54] METHOD AND COMPOSITION FOR IMPROVING FLUX PINNING AND CRITICAL CURRENT IN SUPERCONDUCTORS

[75] Inventor: Donald E. Morris, Kensington, Calif.

[73] Assignee: The Regents of the University of California, Oakland, Calif.

[21] Appl. No.: 783,730

[22] Filed: Oct. 28, 1991

Related U.S. Application Data

[63] Continuation of Ser. No. 389,842, Aug. 3, 1989, abandoned, which is a continuation-in-part of Ser. No. 263,750, Oct. 28, 1988, abandoned.

[51] Int. Cl.$^6$ ............... H01B 12/00; H01L 39/12
[52] U.S. Cl. ............... 505/150; 505/400;
505/725; 505/775; 505/776; 505/779; 505/780;
505/783; 505/785; 505/782; 505/784; 505/482;
505/500; 505/501; 505/230; 252/518
[58] Field of Search ............... 505/1, 775, 776, 779,
505/780, 783, 785, 782, 784, 400, 725; 252/518

[56] References Cited

U.S. PATENT DOCUMENTS

| | | | |
|---|---|---|---|
| 4,826,808 | 5/1989 | Yurek et al. | 505/1 |
| 5,340,794 | 8/1994 | Tallon et al. | 505/500 |

FOREIGN PATENT DOCUMENTS

| | | |
|---|---|---|
| 0292126 | 11/1988 | European Pat. Off. |
| 0295023 | 12/1988 | European Pat. Off. |
| 0358980 | 3/1990 | European Pat. Off. |
| 8809312 | 12/1988 | WIPO ............... 505/1 |

OTHER PUBLICATIONS

Murakami et al. "A New Process with the Promise of High Jc in Oxide ..." *Jap. Journ. of App. Phys* vol. 28, No. 7, Jul. 1989 pp. 1189–1194.

Hwang et al. "Effect of atmosphere on the formation of low $T_c$ and high $T_c$ ..." *Appl. Phys. Lett.* vol. 54 (16), Apr. 1989, pp. 1588–1590.

Shi et al. "Microstructural Analysis of Superconducting Ceramics" *Inter/Micro-88 Conference,* Chicago, Ill. Jun. 27–30, 1988.

McCallum et al. "Problems In The Production of $YBa_2Cu_3O_x$ Superconducting Wire" Advanced Ceramic Materials, vol. 2, No. 3B, Special Issue, 1987 pp. 388–400.

Wisniewski et al. "Magnetization Studies of $YBa_2Cu_3O_{7-x}$ Irradiated ..." Solid State Communications, vol. 65, No. 7, pp. 577–580, Feb. 1988.

Saito "Composition Dependence of Superconductivity ..." *Jap. Jnl Appl. Phys.* vol. 26(5) May 1987 pp. L834–L835.

Escudero "Superconductivity at 90K in the Y–Ba–Al–Cu–O ..." *Jap. Jnl. Appl. Phys.* vol. 26(6) Jun. 1987 pp. L1019–L1020.

Ferreira "Magnetic field alignment of High-Tc Super ..." *Appl. Phys. A* vol. 47 Sep. 1988 pp. 105–110.

Tranquada, "Observation of Alignment of superconducting $YBa_2Cu_3O_x$..." *Phys. Rev. B.* vol. 37(1) Jan. 1, 1988 pp. 519–521.

Osamura "Role of alpha precipitater in flux ..." *Philos. Mag. A* vol. 49(2) 1984 pp. 205–219.

Tamura "Ozone–UV irradiation effects on $Ba_2YCu_3O$ ..." *Appl. Phys. Lett.* vol. 52 (25) Jun. 20, 1988 pp. 2183–2185.

Mandich "Superconducting properties of a 27 Å phase (List continued on next page.)

*Primary Examiner*—Paul Lieberman
*Assistant Examiner*—M. Kupec
*Attorney, Agent, or Firm*—Townsend and Townsend Khourie and Crew

[57] ABSTRACT

Superconducting materials and methods of forming superconducting materials are disclosed. Highly oxidized superconductors are heated at a relatively high temperature so as to release oxygen, which migrates out of the material, and form a non-superconducting phase which does not diffuse out of grains of the material. The material is then reoxidized at a lower temperature, leaving the non-superconducting inclusions inside a superconducting phase. The non-superconducting inclusions act as pinning centers in the superconductor, increasing the critical current thereof.

14 Claims, 14 Drawing Sheets

OTHER PUBLICATIONS in" *Physical Review* vol. 38 No. (7) Sep. 1, 1988 pp. 5031–5034.

Cava "Synthesis of bulk superconducting $YBa_2Cu_3O_8$ . . ." *Nature* vol. 338 Mar. 23, 1989 pp. 328–330.

Peterson "Magnetic Inducement of texture in $Ba_2YCu_3O_x$ . . ." *Comm. of the Amer. Ceram. Soc.* Nov. 1988 pp. 458–459.

Solin "Field-Induced Orientation of Nonlevitated Micro . . ." *Physic. Rev. Lett.*, vol. 60 (8) Feb. 22, 1988 pp. 744–747.

Dagani "New milestones set with bulk, thin-film . . ." *Chem & Eng. News* Nov. 13, 1989 pp. 10–11.

Wisniewski "Magnetization Studies of $YBa_2Cu_3O_x$ . . ." *Solid State Comm.* vol. 65 (7) Feb. 1988 pp. 577–580.

McCallum "Problems in the production of $YBa_2Cu_3O_x$ . . ." *Advanced Cer. Mat'ls* vol. 2 (3B) Jul. 1987 p. 388–400.

Wu "Superconductivity at 93K in a New Mixed-phase Y-Ba-Cu-O . . ." *Phys. Rev. Lett.* vol. 58(9) Mar. 2, 1987 pp. 908–910.

Sherwood "Superconducting properties of $YBa_2Cu_3O_x$ . . ." *Mat. Res Soc. Symp.* vol. 99 Dec. 1987 pp. 503–506.

Komatsu "On the reactions of Quenched BaYCuO . . ." *Jap. Jnl. Appl. Phys.* vol. 27(6) Jun. 1988 pp. L1025–L1028.

Char "Properties of Y-Ba-Cu-O thin films with . . ." *Phys. Rev. B.* vol. 38 (1), Jul. 1, 1988 pp. 834–837.

Kampinski "Bulk synthesis of the 81-K superconductor . . ." *Nature* vol. 336 Dec. 15, 1988 pp. 660–662.

Marsh "Crystal structure of the 80K superconductor . . ." *Nature* vol. 334 Jul. 14, 1988 pp. 141–143.

Campbell et al., *Phil. Mag.* (1968) 18:313–343.

Wang et al., *J. Mater. Res.* (1988) 3:1297–1303.

Morris et al., *Proceedings of Symposium S, 1987 Spring MRS Meeting*, Apr. 23–24, 1987, Anaheim, Calif.

Dinger et al., *High Temperature Superconducting Compounds: Processing and Related Properties*, Whang and Das Gupta, eds., pp. 23–40 (1989).

Willis et al., *Matl. Res. Soc. Symp. Proc.* (1988) 99:391–394.

Pool, *Science* (1988) 244:914–916.

*High Tc Update*, Apr. 15, 1989, pp. 2 and 7.

*High Tc Update*, Jun. 15, 1989, pp. 1 and 7.

Sleight, *Supercurrents* (1989) 9:19.

Dagani, *Chem. & Eng. News*, Nov. 13, 1989, pp. 22–23.

Yeshurun et al., *Phys. Rev. Lett.* (1988) 60:2202–2205.

Gammel et al., *Phys. Rev. Lett.* (1987) 59:2592–2595.

Palstra et al., *Phys. Rev. Lett.* (1988) 61:1662.

Tinkham, *Phys. Rev. Lett.* (1988) 61:1658.

Morris et al., *Physica C* (1989) 159:287–294.

Morris et al., *Phys. Rev. B* (1989) 39:7347–7350.

Bormann et al., *Appl. Phys. Lett.* (1989) 54:2148–2150.

Chui, San Jose Mercury News, Jun. 13, 1989, p. 2C.

Davidson, San Francisco Examiner, Jun. 11, 1979, p. A–1.

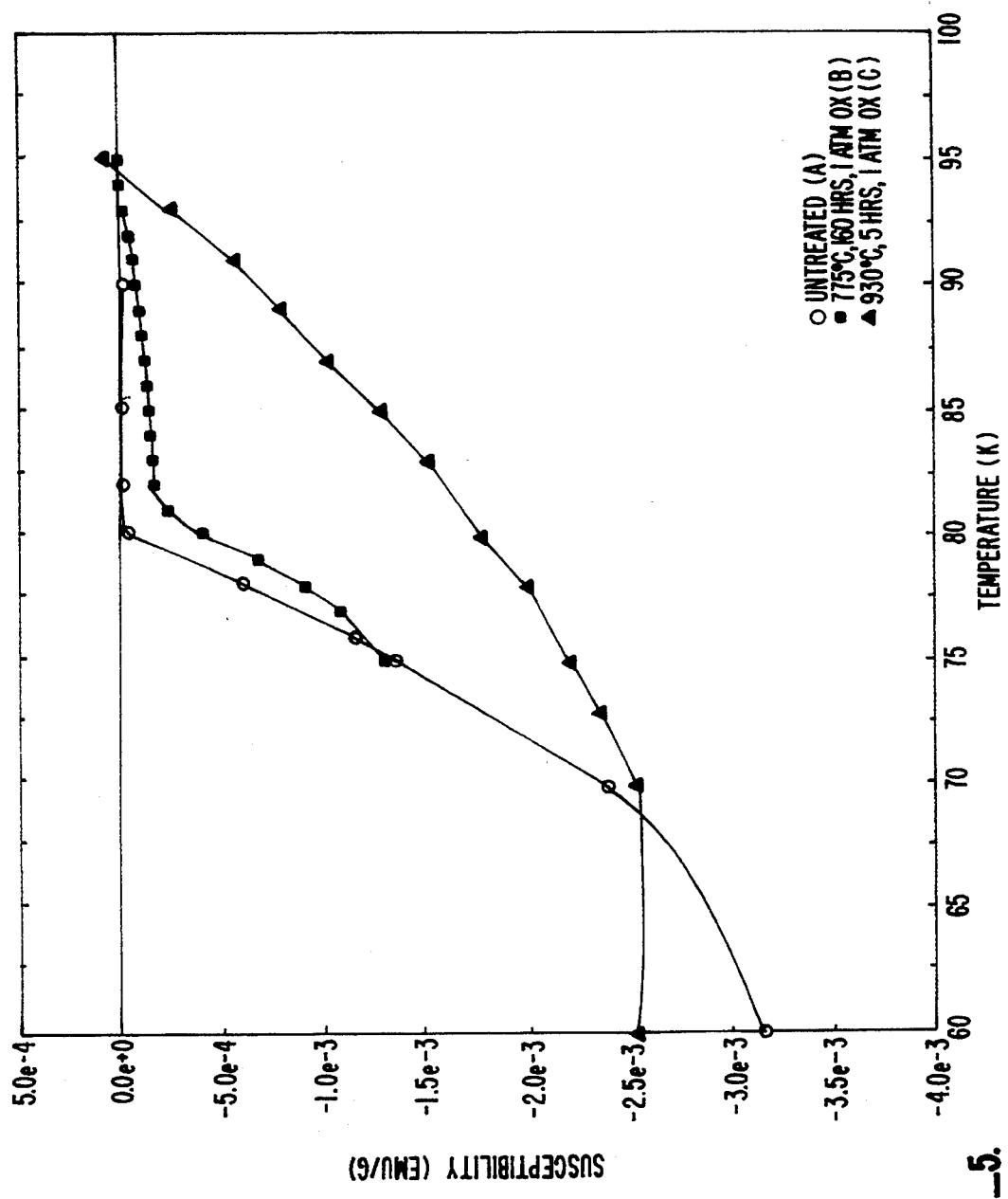
FIG._5.

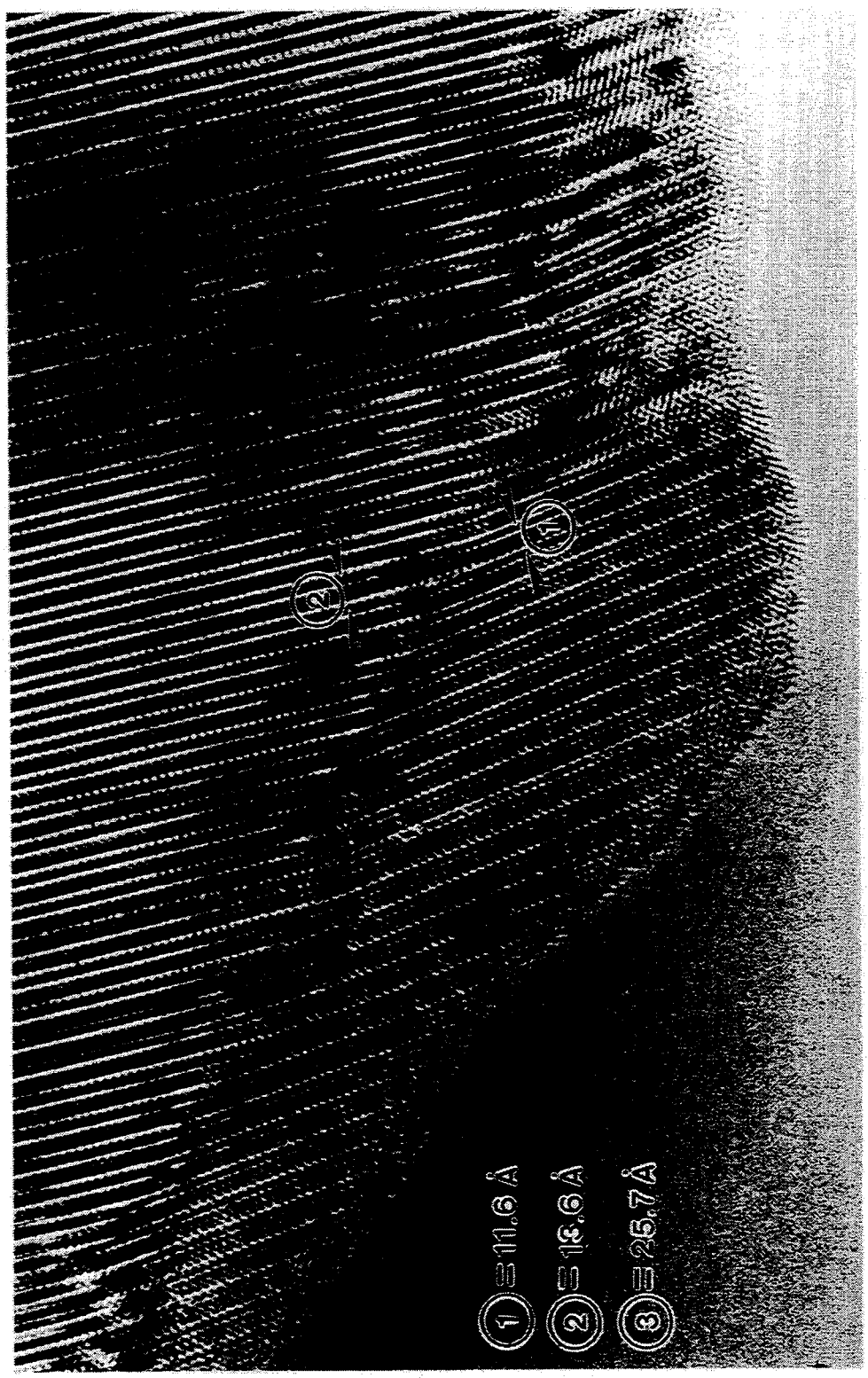
FIG._6.

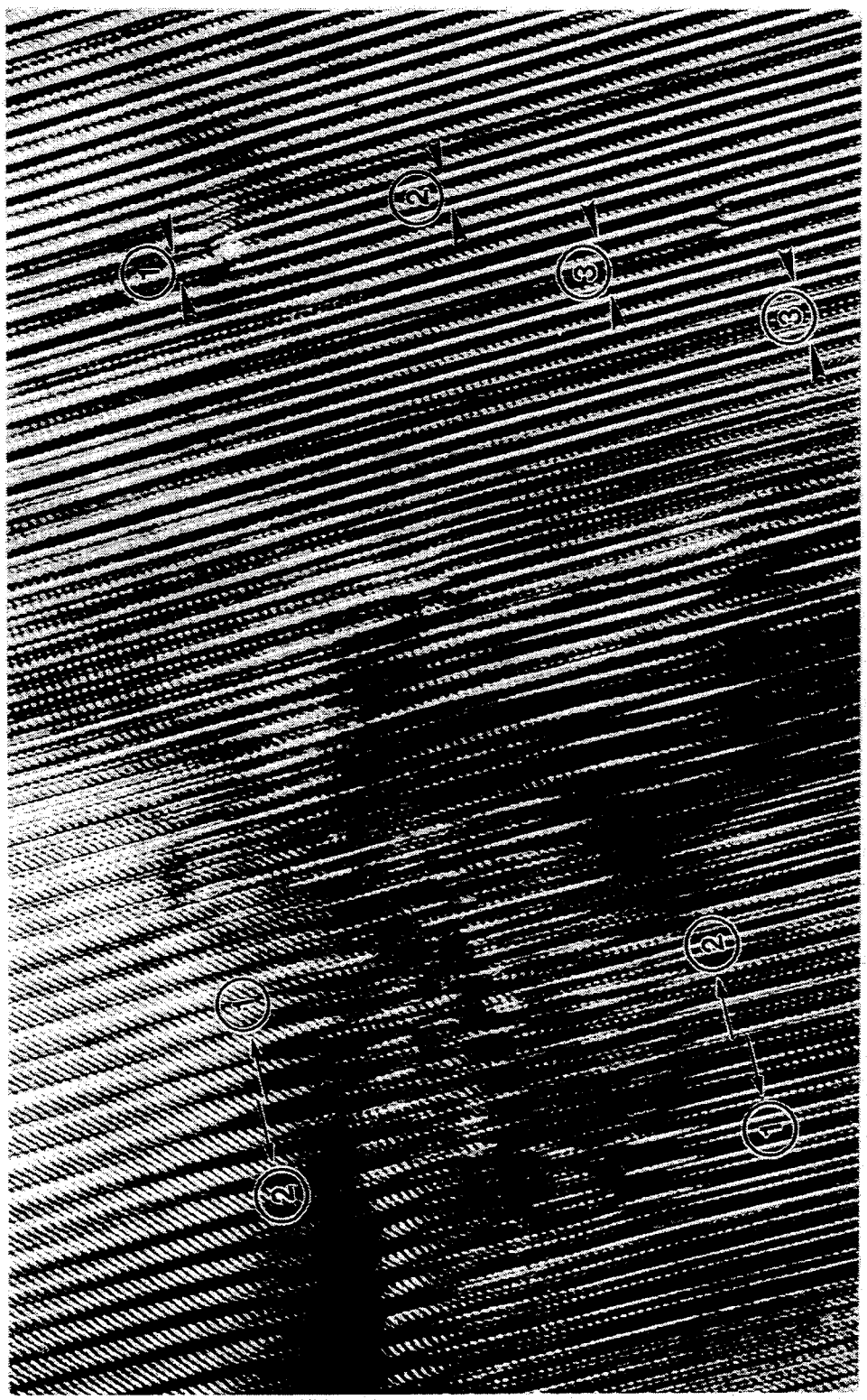
FIG._7.

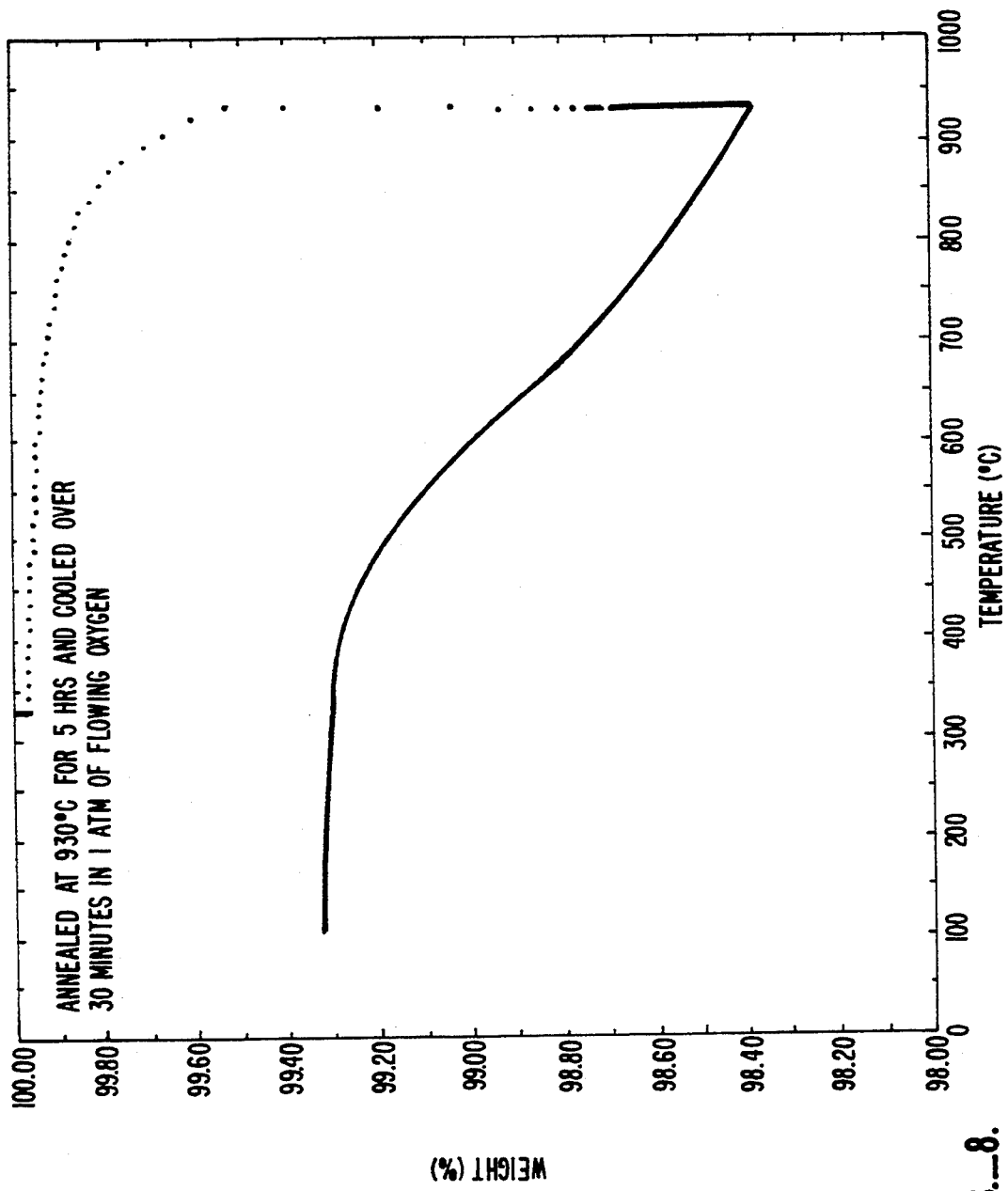
FIG._8.

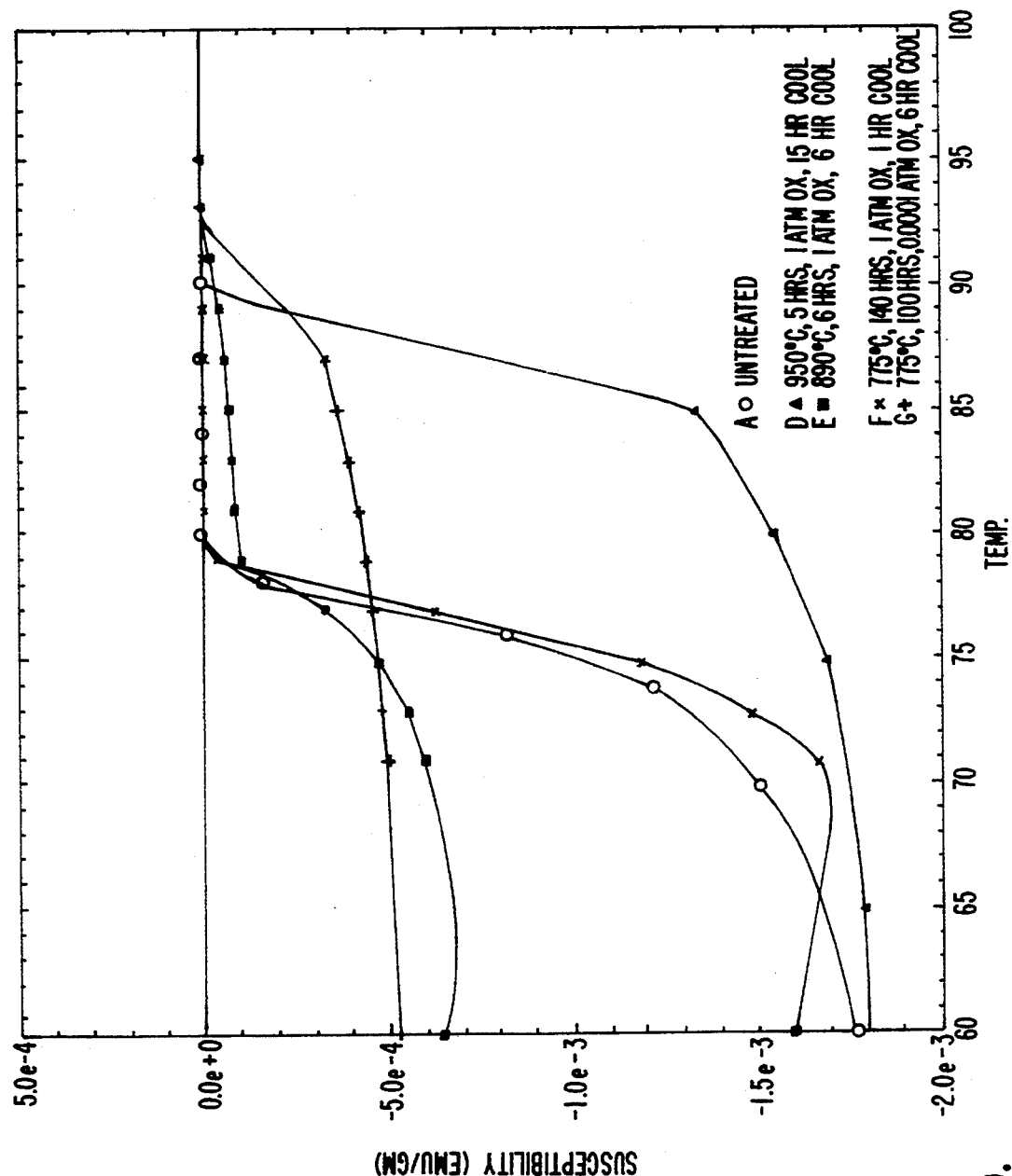
FIG._9.

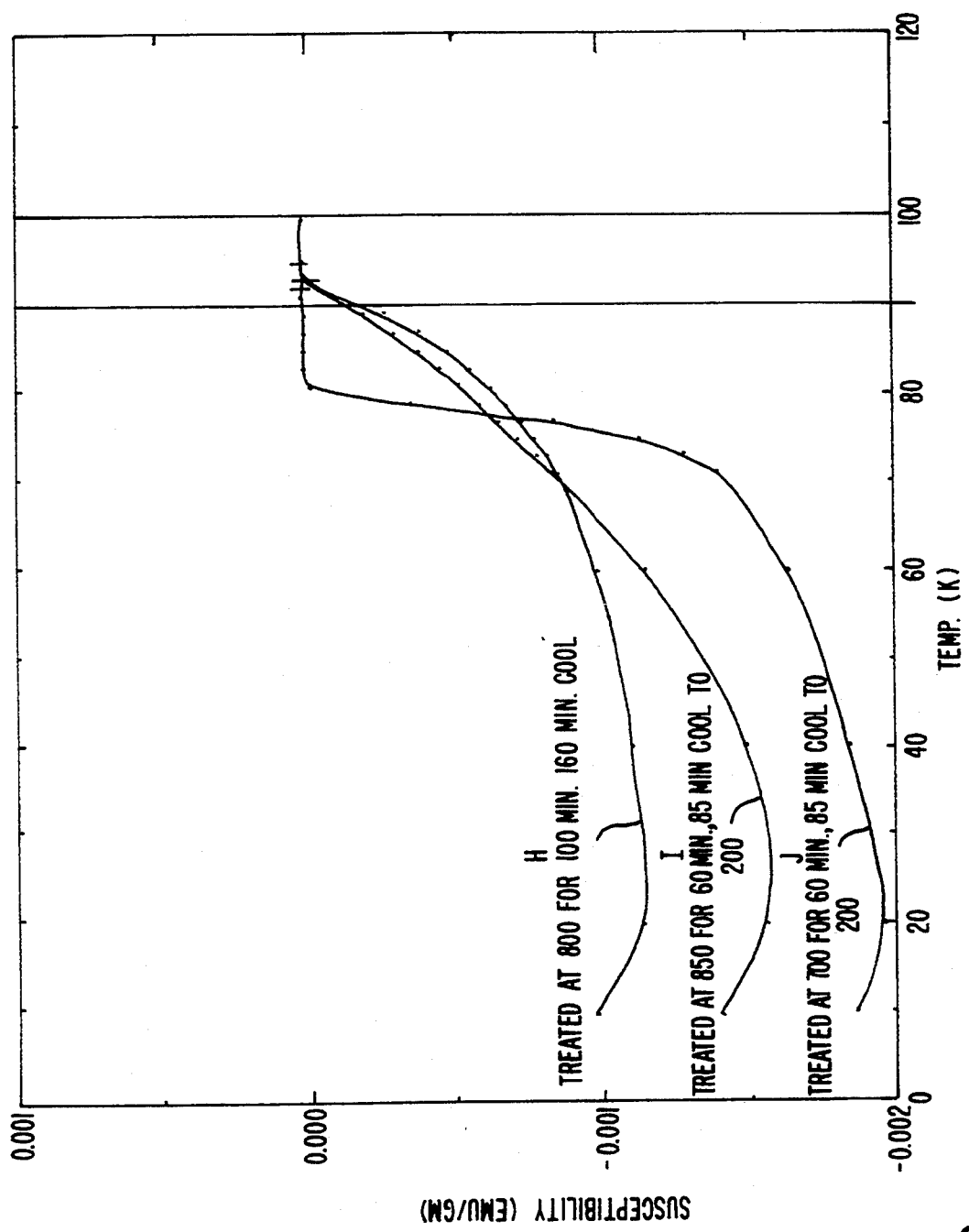
FIG._10.

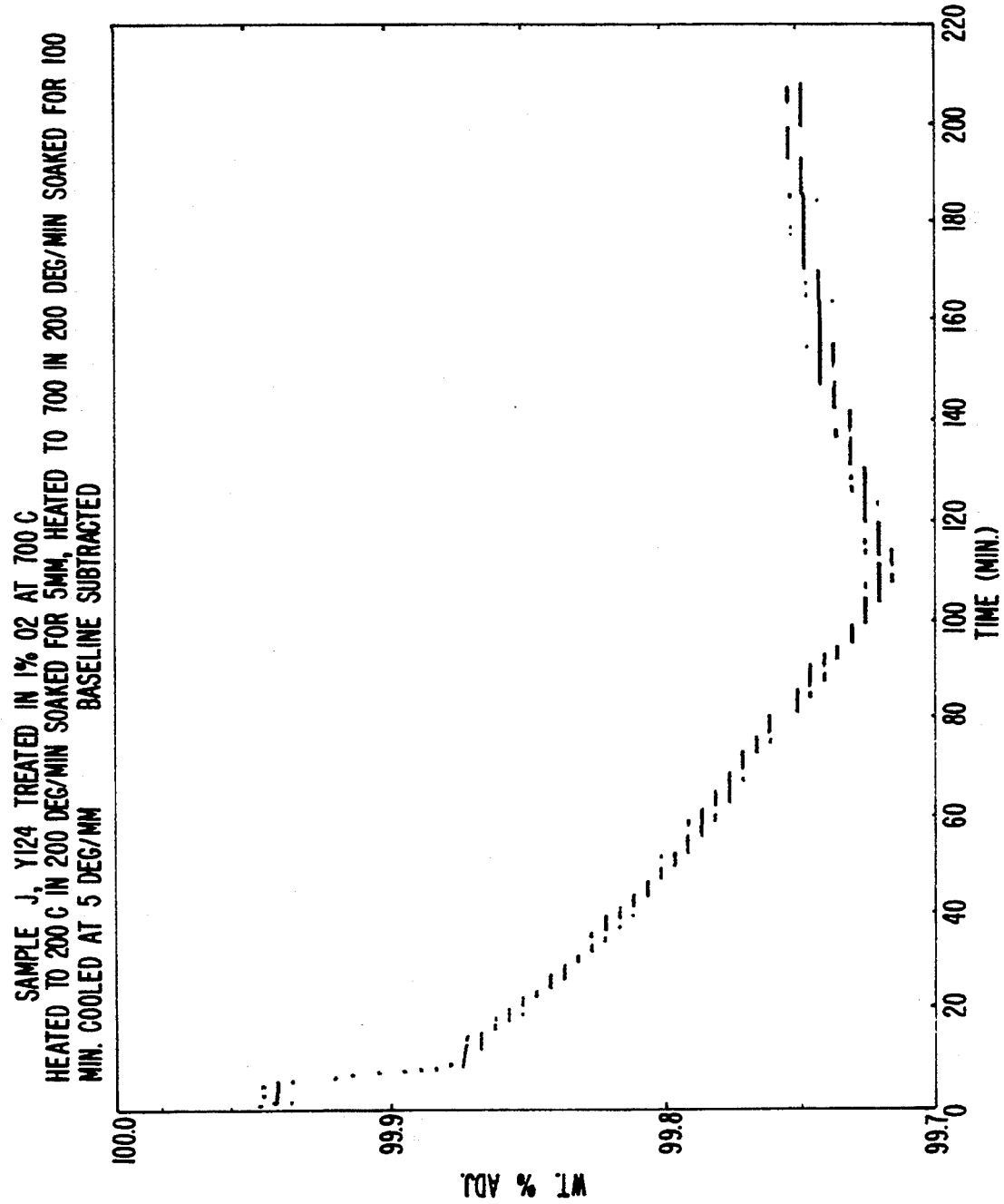
FIG._11.

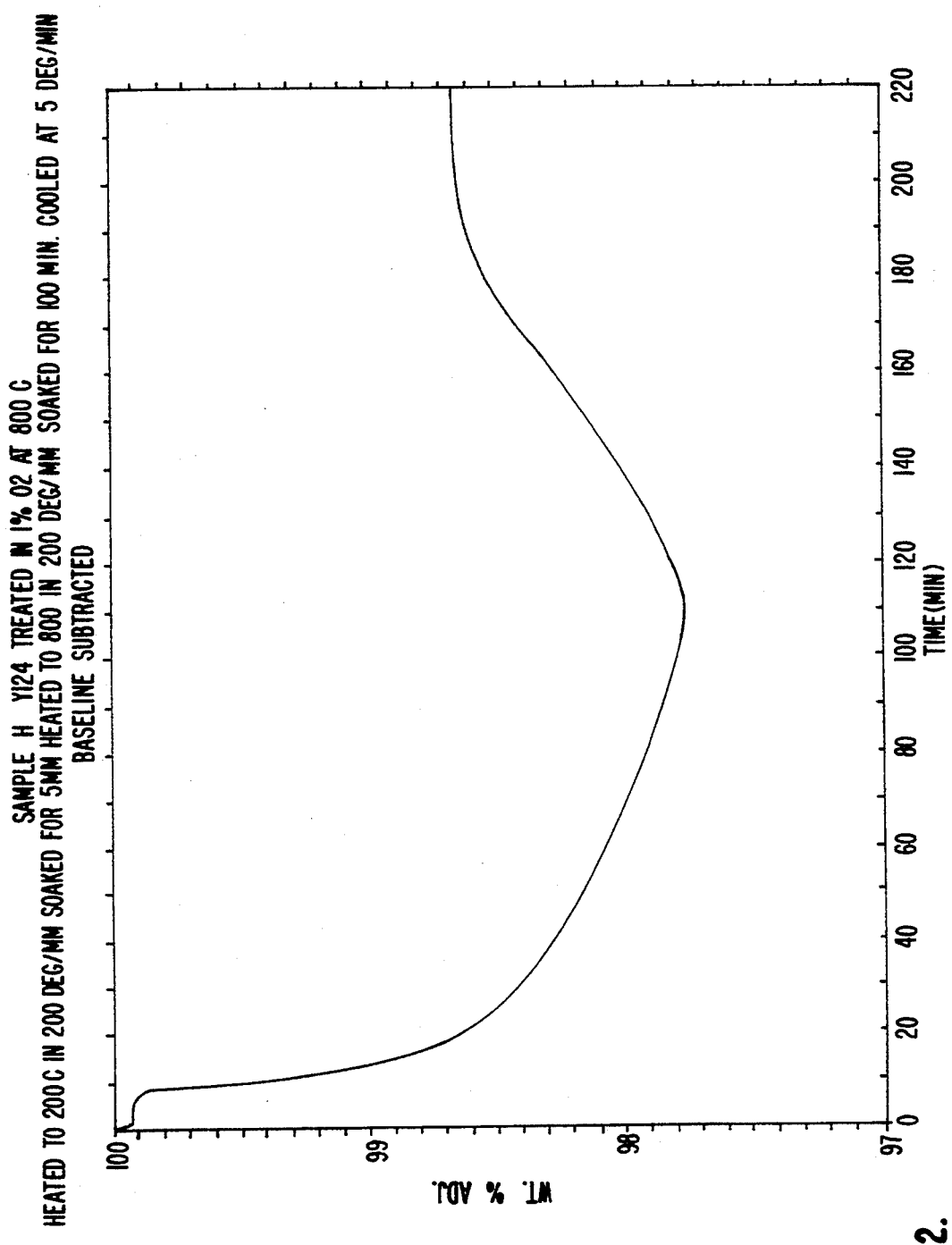
FIG._12.

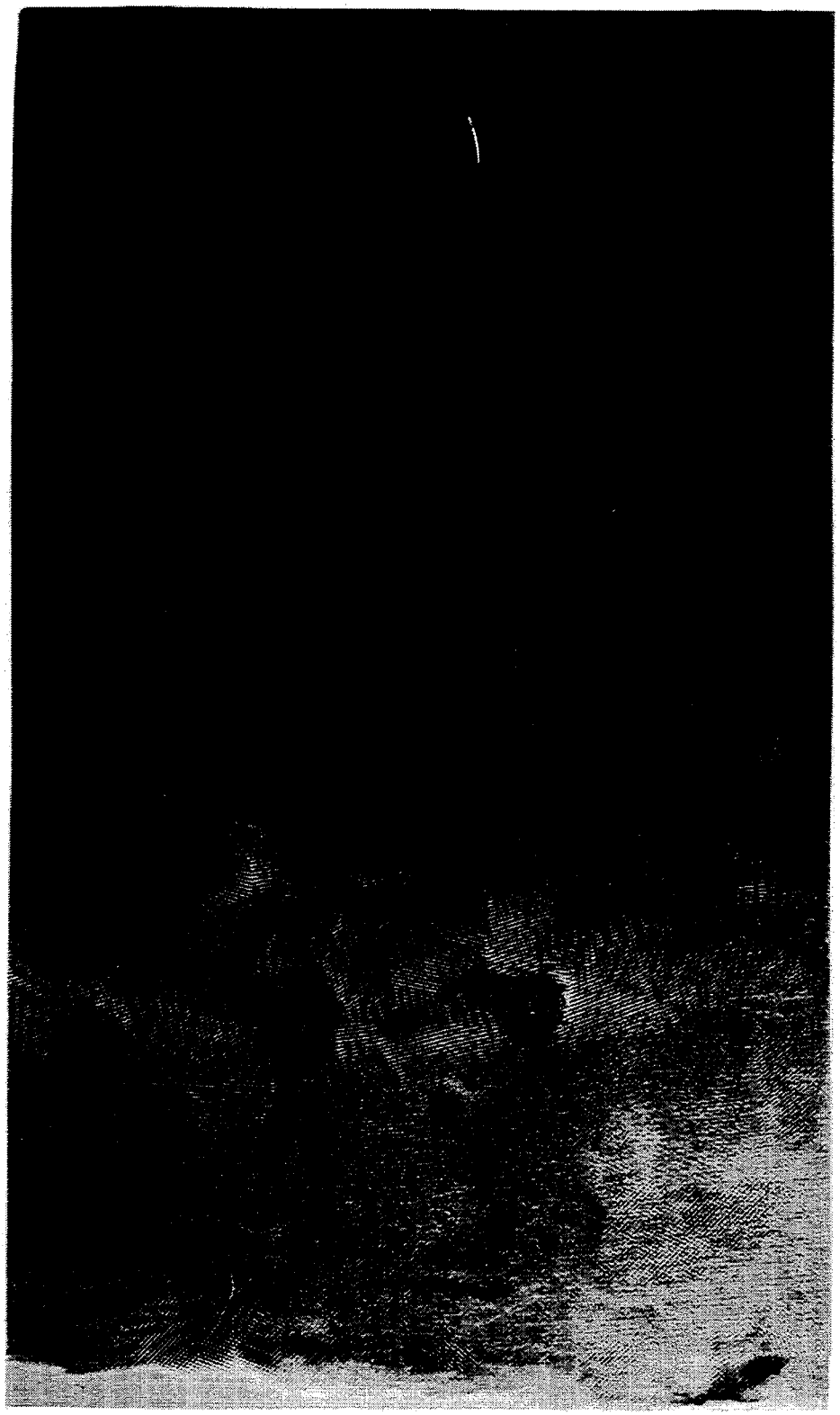
FIG._13.

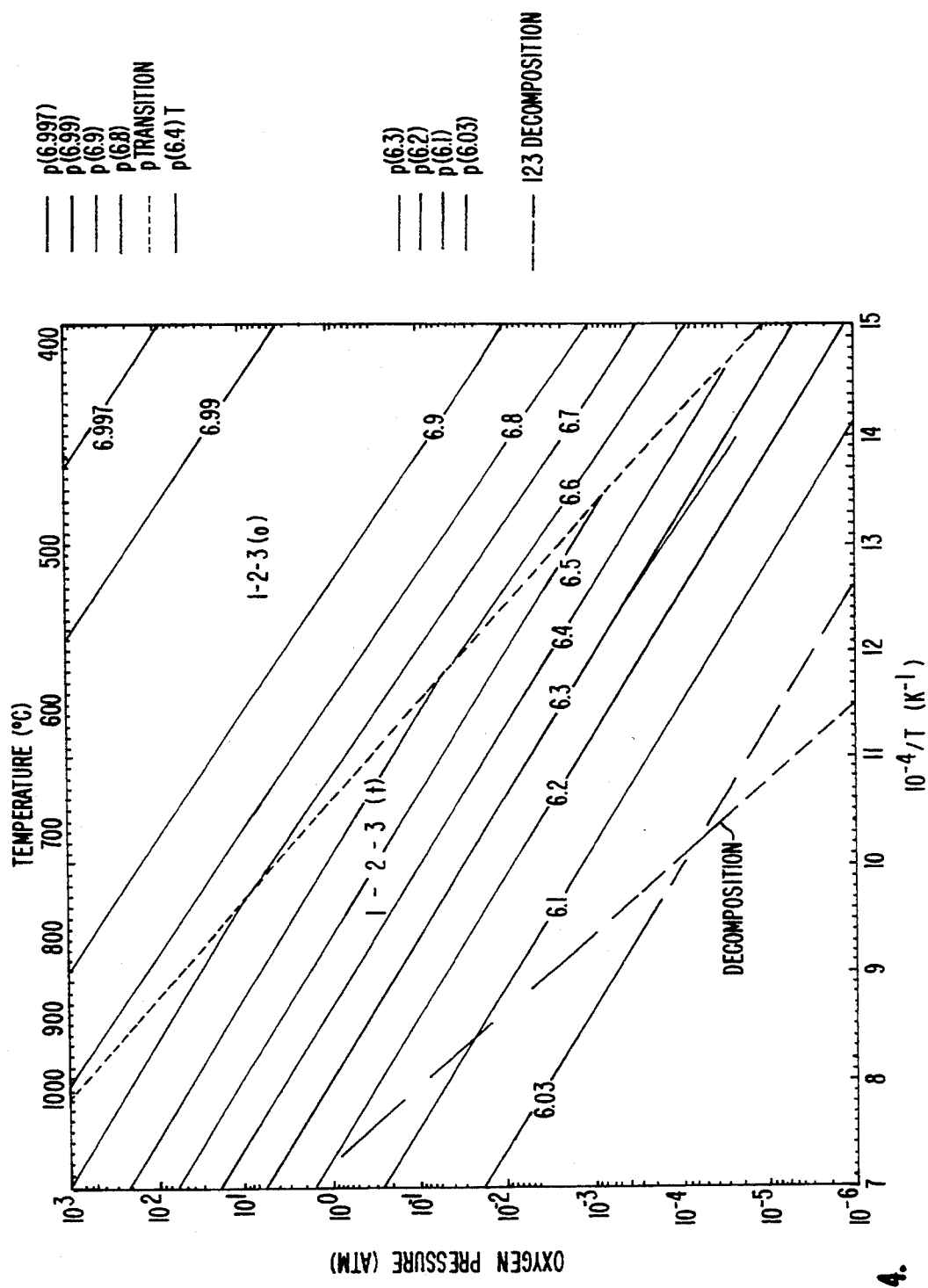
FIG._14.

METHOD AND COMPOSITION FOR IMPROVING FLUX PINNING AND CRITICAL CURRENT IN SUPERCONDUCTORS

GOVERNMENT RIGHTS NOTICE

The inventions herein arose in the course of, under, or in connection with Contract No. DE-AC03-76-SF-00098 between the Department of Energy and the University of California at Berkeley.

CROSS-REFERENCE TO RELATED APPLICATION

This application is a continuation of Ser. No. 07/389,842, filed Aug. 3, 1989, now abandoned, which application is a continuation-in-part of application Ser. No. 263,750, filed Oct. 28, 1988 and incorporated herein by reference for all purposes.

BACKGROUND OF THE INVENTION

This invention relates to superconductor systems, and in particular to crystalline structures having superconducting properties.

Theoretical and experimental research in the field of superconducting materials by thousands of researchers has led to the discovery of a variety of oxide compounds which become superconducting at relatively high temperatures ($T_c$), i.e., above about 20° K. The widely known high temperature superconductors are oxides, and presently contain (1) copper and/or bismuth, (2) barium or other alkaline earths such as strontium or calcium, and (3) trivalent elements such as yttrium. Rare earth elements having atomic numbers ranging from 57 to 71 (lanthanum to lutecium), are substituted for yttrium in some materials, as are thallium or bismuth. Representative of superconductors are the following:

(1) oxide materials containing lanthanum, strontium and copper, bearing the formula $La_{2-x}Sr_xCuO_4$, commonly referred to as L-S-C-O, and recently discovered variants thereof such as materials in which La substituted with, for example, praseodymium, neodymium, uranium, thorium, cerium and others containing a tetravalent ion in place of Sr;

(2) oxide materials containing yttrium, barium and copper, bearing the formula $YBa_2Cu_3O_{7-\delta}$, commonly referred to as 1-2-3 (rare earth elements can be substituted for yttrium, and the resulting compounds are also superconducting). Other Y-Ba-Cu materials include 1-2-4 and 2-4-7;

(3) oxide materials containing bismuth, strontium, calcium and copper, bearing such formulas as $Bi_2CaSr_2Cu_2O_{8+x}$ and $Bi_2Ca_2Sr_2Cu_3O_{10+x}$, commonly referred to as B-C-S-C-O, and related materials including those in which Pb and copper replace Bi;

(4) oxide materials containing thallium, barium, calcium and copper, bearing such formulas as $Tl_2Ba_2CuO_x$, $Tl_2CaBa_2Cu_2O_x$, $Tl_2Ca_2Ba_2Cu_3O_x$, $Tl_2Ca_3Ba_2Cu_4O_x$, $TlCaBa_2Cu_2O_x$, and $TlCa_2Ba_2Cu_3O_x$, commonly referred to as T-C-B-C-O, and related materials including those in which Pb and/or Cu replace Tl; and (5) oxide materials containing bismuth, barium, potassium and copper, bearing the formula $Ba_{1-x}K_xBiO_3$, identified as B-K-B-O.

Copending application Ser. No. 263,750 discloses certain improved superconductor materials and methods of manufacture thereof, and is incorporated herein by reference for all purposes. See also Morris et al., "Eight New High Temperature Superconductors With the 1:2:4 Structure", *Phys. Rev.*, 39, 7347 (April, 1989), which is also incorporated herein by reference for all purposes.

Introduction of defects in intermetallic type II superconductors was proposed to increase their critical current density. See, for example, Campbell et al., "Pinning of Flux Vortices in Type II Superconductors," *Phil. Mag.*, 18, 313 (1968). Thermally activated flux creep has also been recognized as a problem with high-temperature superconductors.

However, in the case of high-temperature superconductors, the introduction of defects to increase critical current density to a useful level has met with only limited success. For example, in Gammel et al., *Phys. Rev. Lett.*, 59, 2592 (1987), an increased density of twin boundaries provides only moderate improvement in flux pinning. Some increase in low temperature $J_c$ in $YBa_2Cu_3O_7$ in strong magnetic fields was achieved by the introduction of point defects by neutron irradiation in, for example, Willis et al., "Radiation Damage in $YBa_2Cu_3O_{7-x}$ By Fast Neutrons", High Temperature Superintroductors, MRS Symposium Proceedings Vol. 99, 391–94 (1988). However, even in Willis et al., the increase in $J_c$ was limited and at 7° K. and B=4T increased to only about $10^4$ A/cm$^2$ after about $10^{18}$ n cm$^{-2}$ above which value superconductivity was adversely effected by the neutron dose. This may limit the wide application of neutron irradiation to provide improvement in flux pinning. Critical currents in polycrystalline high-temperature superconductors are still further reduced by weak links at the grain boundaries, which are made worse by high porosity, misalignment of the crystalline axis of adjacent grains, and by formation and accumulation of non-superconductor phases (compounds) at boundaries between superconducting grains.

The need for additional high temperature superconductors and methods of manufacturing superconductors is great, not only to achieve superconductors with higher $T_c$'s, but also to achieve superconductors with improved $J_c$'s in magnetic fields, improved mechanical properties, stability, and ease of processing.

SUMMARY OF THE INVENTION

Improved superconductors and methods of manufacturing superconductors are disclosed. In one embodiment the invention provides a method of producing pinning centers in the grains of superconductor material and in some embodiments controlling and optimizing the size, shape, and distribution of pinning centers within grains of superconductors which have multiple phases whose stability depends on oxygen content, especially including high temperature superconductors. The invention, further, provides for suppression of the formation of non-superconducting phases at grain boundaries and preparation of dense superconductors with low porosity.

Accordingly, in one embodiment the invention provides a method of forming a superconductor comprising the steps of heating a starting material to form a first, non-superconducting immobile phase, and an intermediate phase; and oxidizing or reducing the intermediate phase to form a superconductor phase which is interspersed by the non-superconducting phase.

A high-temperature superconductor is also disclosed. The superconductor comprises a first, superconducting phase and a second phase dispersed within crystals of said first, superconducting phase. The second phase may be a superconducting or non-superconducting phase and, in some embodiments, a third phase is provided which may also be either superconducting or non-superconducting.

In an alternative embodiment the superconductor material is formed by the steps of heating a starting material, the step of heating forming a second phase, and an intermediate phase; and oxidizing or reducing the intermediate phase to form a superconductor phase interspersed by the second phase.

A method of using a superconductor is also disclosed. In one embodiment the superconductor has a first, superconducting phase and a second phase. The superconductor is placed in a magnetic field and oriented such that magnetic flux lines are substantially parallel to planes of the second phase.

In alternative embodiments, the method of forming a superconductor comprises the step of mixing a superconducting material or its formation materials in the presence of a nucleation center under conditions that form a superconducting phase and a non-superconducting phase by removal of oxygen.

BRIEF DESCRIPTION OF THE FIGURES

FIG. 5 is a set of susceptibility curves for 1-2-4 and material formed according to one embodiment of the invention;

FIG. 6 is a Transmission Electron Micrograph (TEM) of material formed according to one embodiment of the invention;

FIG. 7 is a TEM of another portion of the material shown in FIG. 6;

FIG. 8 is a weight loss curve for material formed according to one embodiment of the invention;

FIG. 9 is a set of susceptibility curves for additional materials formed according to one embodiment of the invention;

FIG. 10 is a set of susceptibility curves for additional materials formed according to one embodiment of the invention;

FIG. 11 is a weight loss curve for a sample "J";

FIG. 12 is a weight loss curve for a sample "H";

FIG. 13 is a TEM of a mixed phase Eu-Ba-Cu-O superconductor; and

FIG. 14 illustrates the stability regions of 1-2-3.

DETAILED DESCRIPTION OF THE PREFERRED EMBODIMENTS

Contents

Figure 1:
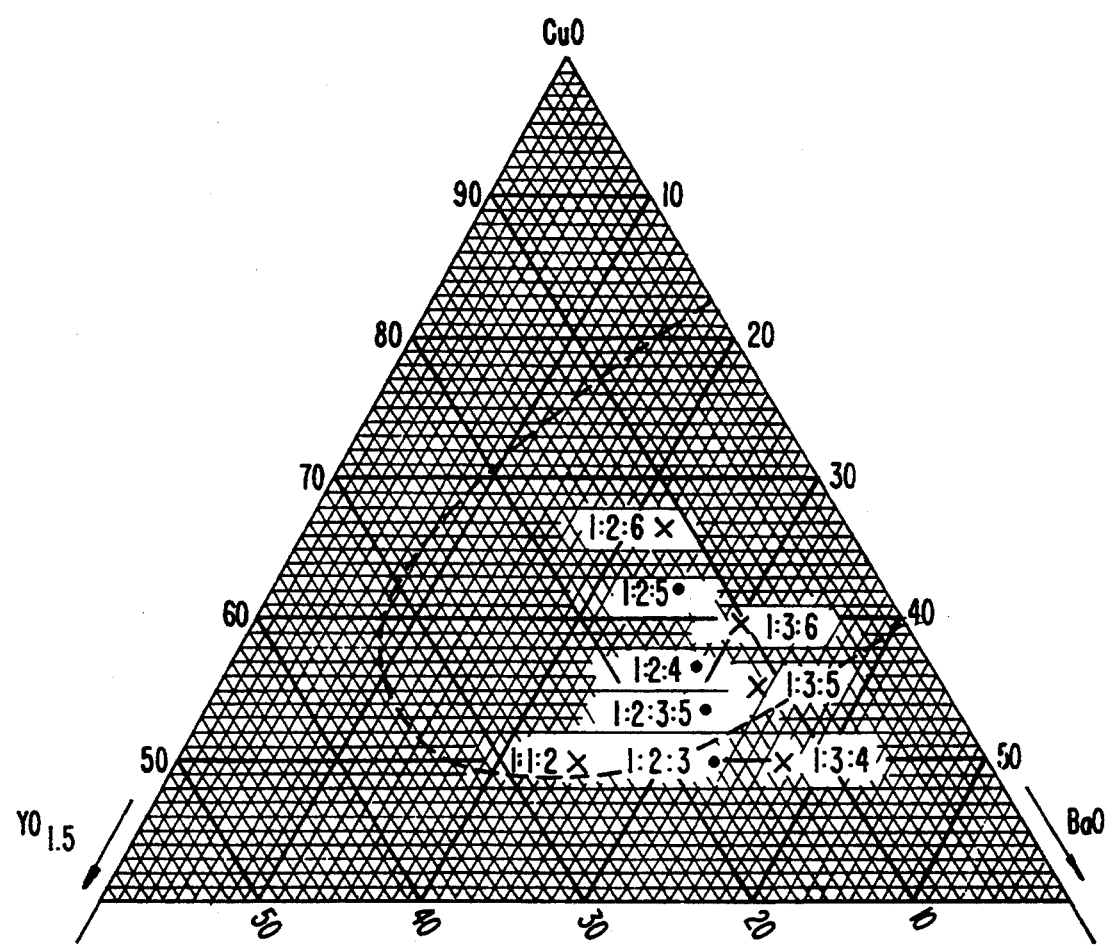
FIG. 1 is a Pseudo-ternary phase diagram of the $Y_2O_3$-BaO-CuO system at $P(O_2)=100$ bar and $T=930°$ C. The positions of dots and crosses indicate the starting stoichiometries—the corresponding cation ratios are indicated. The dots indicate compositions which resulted in formation of the 124 phase.

I. General
II. Overall Description of Synthesis
   A. 1-2-4 Starting Material
   B. 1-2-3 Starting Material
   C. Other Starting Materials
III. Detailed Description of the Synthesis
   A. Synthesis of Starting Materials
   B. Formation of Non-Superconducting Phase
   C. Formation of Nucleation Regions
   D. Re-Diffusion of Oxygen
IV. Example 1—Conversion of 1-2-4 into 1-2-3 with Flux Pinning Centers
   A. Synthesis of 1-2-4
   B. Formation of Flux Pinning Centers in 1-2-3 from 1-2-4
   C. Formation of Flux Pinning Centers in 1-2-3
V. Example 2—Synthesis of Y-Ba-Cu and Dy-Ba-Cu Interspersed by Non-Superconductor
VI. Example 3—Partial Conversion of 1-2-4 to 1-2-3 Plus a Non-Superconducting Phase
VII. Use of Materials Disclosed Herein

I. General

In general, the invention herein is applied to materials in which two phases can be found by means of the addition or removal of an easily diffused material such as oxygen and concurrent production of a second phase which is non-superconducting or has different superconducting characteristics than a first, superconducting phase. The invention in some aspects provides for the partial reaction of a first superconducting material to a second superconducting material within crystals of the first superconducting material. Lattice boundaries of the first and the second superconducting materials will act as effective pinning centers. In another aspect of the invention, a material including the first and second superconducting materials is formed, along with a third, non-superconducting phase within crystals of the superconducting materials. In still another aspect of the invention, a starting material is used to form a superconducting material and a non-superconducting material, crystals of the superconducting material interspersed within the crystals of the non-superconducting material.

By way of example, the invention is illustrated herein with regard to the formation of superconducting or non-superconducting phases within the grains of yttrium-barium-copper oxide superconductors, but the invention is not so limited. Examples of other materials suitable to such a process are materials which have multiple phases whose stability depends upon oxygen content. Such materials include but are by no means limited to the Y-Ba-Cu-O materials, the Tl-Ca-Ba-Cu-O materials, the Bi-Ca-Sr-Cu-O materials, the La-Sr-Cu-O materials, the Ba-K-Bi-O materials, and other high $T_c$ oxide superconductors.

One important aspect of the invention is that a composition which forms two stable phases which vary in their oxygen content is used to form a superconducting phase interspersed by second regions which act as flux pinning centers and which do not migrate significantly to grain boundaries. Therefore, the invention will find use not only in the above-mentioned materials, but also in many materials of which exemplary materials are discussed in detail herein.

In some embodiments the invention provides magnetic flux pinning centers having controllable or predictable size and shape within the grains of the crystals. By varying the size of the pinning centers, the pinning strength of the material may readily be adjusted. In preferred embodiments the size of the pinning center is adjusted to be about the coherence size, and in some embodiments between 1 and 1000 Å, in preferred embodiments between 10 and 100 Å in the plane of the material, and in 1-2-3, for example, the pinning centers have dimensions of about 20 Å in the plane of the superconducting material and about 2 Å perpendicular to the plane. Even atomic scale defects such as partial dislocations which produce strain fields will be sufficient in some embodiments to substantially increase (i.e., increase by about 5% or more) the critical current of the material.

Flux pinning centers may also have improved orientations according to the invention herein. One embodiment of the invention herein provides pinning centers of a desired orientation such that the fluxoids may be pinned in point or line defects that lie substantially along lines or planes, rather than points. The material may then be optimally used in an orientation wherein such planes or lines of defects lie in the planes of or parallel to direction of the fluxoid. These planes or lines in some embodiments lie along the a.b plane of the superconductor while in other embodiments they lie along the C axis. Current is, similarly, passed along the plane of the defects. In Cu-based superconductors, this plane will generally lie in the plane of $CuO_2$ sheets. It is preferred that while the current and magnetic flux lines lie in the same or parallel planes, that they be substantially perpendicular to each other since the magnetic field produced by a current is perpendicular to the current and the objective is to transmit strong or concentrated currents or strong magnetic fields.

II. Overall Description of Synthesis

A. 1-2-4 Starting Material

In one preferred embodiment, the invention utilizes the $YBa_2Cu_4O_8$ (1-2-4) phase or one of its rare earth analogues as a starting material. The 1-2-4 phase is heated in low pressure oxygen such that it decomposes at least in part into a 1-2-3 tetragonal (non-superconducting) phase plus one or more non-superconducting copper rich phase(s) such as CuO and/or $BaCuO_2$ and/or $Y_2BaCuO_5$ and/or $Cu_2O$. This treatment of the 1-2-4 phase is carried out at a temperature such that oxygen from the reaction diffuses out of the grains of superconductor but, in this embodiment, the temperature and pressure are adjusted to prevent decomposition of 1-2-3. This will leave a multiphase system with small Cu-rich phase regions within the 1-2-3 crystallites and any remaining 1-2-4 crystallites if present. The temperature and $P(O_2)$ is, in preferred embodiments, chosen such that x is between about 6.1 and 6.6 in $Y_1Ba_2Cu_3O_x$ under equilibrium conditions. The step of heating in low pressure oxygen is optionally followed by the step of heating at somewhat higher temperatures such that the Cu diffuses small distances and increases the size scale of the pinning centers for further optimized flux pinning.

The 1-2-3 material is then treated with oxygen at lower temperatures and re-oxidized to the orthorhombic superconducting phase, leaving the Cu-rich non-superconducting inclusions trapped inside the 1-2-3 material, plus any remaining 1-2-4 phase. Superconducting materials prepared according to the invention will be particularly useful in conditions under which thermally activated flux creep is important. For example, the materials will find use in high temperature conditions in strong magnetic fields.

B. 1-2-3 Starting Material

In a second preferred embodiment, the starting material is the 123 material $YBa_2Ca_3O_x$ or its rare earth substituted analogues. The 123 phase is heated in a low partial pressure oxygen ($P(O_2)$) or in a partial vacuum. The $P(O_2)$ is chosen low enough, e.g., between about $10^{-1}$ bar to $10^{-6}$ bar or less (about 1 ppm $O_2$ or less) at temperatures about 500° to 600° C. so that x is less than about 6.2 to 6.0 in $YBa_2Cu_3O_x$ under equilibrium conditions. The required pressure will depend on temperature. Increasing the distance below the stability line in FIG. 14 at a given temperature will be preferred to increase the driving force of the reaction. Under these conditions the 123 compound is unstabilized and begins to separate locally into non-superconductors such as $Y_2Ba_1Cu_1O_5$, $BaCuO_2$, $CuO_1$, $Cu_2O$, etc. In this embodiment the decomposition is preferably halted before the decomposition is complete. The temperatures and pressures selected for decomposition of 1-2-3 will vary over a wide range of values in addition to the above-cited values. Temperatures and pressures for decomposition may be selected for 1-2-3 based upon the stability information presented in Borman et al., *Appl. Phys. Lett.*, 54 (21) (May 22, 1989), which is incorporated herein by reference. The sample is cooled and then re-oxygenated at a higher $P(O_2)$ (e.g., $P(O_2)$ of $\approx 1$ bar). The re-oxidation could, alternatively, be done before cooling. The result is non-superconducting inclusions precipitated within the superconducting grains. The result is similar to the first embodiment, except the chemical composition of the inclusions is different and their morphology will also differ.

C. Other Starting Materials

In a third preferred embodiment, the starting material is the bismuth-strontium-calcium-copper-oxide superconductor. The 2122 phase $Bi_2Sr_1Ca_2Cu_2Ox$ and the 2223 phase $Bi_2Sr_2Ca_2Cu_3Ox$ are each stable at different $P(O_2)$ at the same temperature (e.g., see Endo et al., "Preparation of High Tc Phase of Bi-Sr-Ca-Cu-O Superconductor," *Jap. Journal of App. Phys.*, August 1988, pp. 1446, which is incorporated herein by reference). Thus interconversion of $2223 \rightarrow 2122 + CaCuO_2$ and/or other non-superconducting phases is possible by heating 2223 in an increased $P(O_2)$ of $\approx 10^{-3}$ atm or above following a procedure similar to that set forth above.

In another preferred embodiment a high $P(O_2)$ is applied to a BCSCO 2-1-2-2 superconductor of the general formula $Bi_2Ca_1Sr_2Cu_2O_x$. This composition has been shown to be unstable at high $P(O_2)$ at, for example, 600°–800° C. (see, for example, Morris et al., "Oxygen Concentration Effect on Tc of the Bi-Ca-Sr-CuO Superconductor," *Phys. Rev. B.*, Vol. 39, No. 10, pp. 6612 (1989), which is incorporated herein by reference) as shown by a decreasing low temperature Meissner diamagnetism with increasing treatment time or temperature, but with an unchanging diamagnetism onset temperature. Therefore, heating BCSCO superconductor in high $P(O_2)$ will cause precipitation of non-superconducting phases in a manner similar to 1-2-3 heated in low $P(O_2)$. A subsequent anneal at a lower temperature will optimize the superconducting properties and $T_c$ while avoiding diffusion of the non-superconducting precipitate which could make pinning centers unduly large.

In an alternative embodiment, a high $P(O_2)$ is applied at elevated temperature to the $Ba_{1-x}K_xBiO_3$ (BKBO) superconductor. This causes oxidation of Bi to $Bi^{+5}$ and thereby de-stabilizes the superconductor. The rest of the procedure follows the above embodiment. In the case of BKBO an added advantage is that evaporation of K is suppressed by the high $P(O_2)$.

In another alternative embodiment, the above process is applied to BSCCO 2223 ($Bi_2Sr_2Ca_2Cu_3O_x$). Instability of the superconducting compound will result from the reaction $Bi^{+3}$ to $Bi^{+5}$.

In yet another embodiment, applicable to thallium-containing superconductors such as $Tl_2Ba_2CaCu_3O_x$, reduced $P(O_2)$ reduces $Tl^{+3}$ to $Tl^{+1}$ and de-stabilizes the superconductor. Superconductivity may then be restored by re-oxidation, leaving non-superconducting inclusions for pinning. Application of high $P(O_2)$ prevents the reaction:

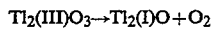
$$Tl_2(III)O_3 \rightarrow Tl_2(I)O + O_2$$

so as to prevent evaporation and consequent loss of Tl and permits controlling the synthesis of Tl superconductor with more uniform structure since the Tl concentration does not vary. Also, the resulting fully oxidized Tl will give an optimal $T_c$.

Other materials to which the invention herein may be applied will be readily apparent to those skilled in the art.

III. Detailed Description of the 1-2-4/1-2-3 Synthesis

A. Synthesis of Starting Materials

The present invention is, by way of example, applicable to superconductor materials which contain or are fabricated from metals or metal oxides. Preferred metals have several valence states. Among these, copper and bismuth are particularly preferred.

These metals or metal oxides may be combined with other metals or metal oxides. Included among the latter are divalent metals such as, for example, barium, strontium, calcium and cadmium; trivalent metals such as, for example, yttrium, scandium, bismuth, thallium; transition metals; the rare earth elements (lanthanum through lutecium); and metals in general which are highly electro-positive, or have large electric polarizabilities. Preferred among the rare earth elements are neodymium, samarium, europium, gadolinium, dysprosium, holmium, erbium and thulium.

In addition to the elemental metals and the metal oxides, the metals used in the preparation of the superconductors of the present invention may be in the form of nitrates, carbonates, oxalates, tartrates, and any other form which yields the oxide upon heating in oxygen. The metals used in the process may also be in the form of mixed oxides or compounds, that is to say, compounds each of which incorporate more than one of the metals.

In preferred embodiments, metal oxides are used in a chemical and physical form which will render them highly reactive at elevated temperatures. Examples include the use of finely divided particles to provide large surface energies, and chemical forms such as peroxides or mixed oxides which have lower chemical binding energy than either the desired product or other compounds which can be formed from the metals or metal oxides. In the case of barium, the preferred form is BaO. In the case of copper, the preferred form is CuO. In the case of yttrium, the preferred form is $Y_2O_3$.

The metals or metal compounds may be combined in relative amounts such that the atomic ratio of the metals is approximately the same as that of the superconductor to be formed. For example, when the desired compound is $YBa_2Cu_4O_8$, the yttrium, barium and copper metals are combined in the atomic ratios of about 1:2:4.

As an alternative, the metals or metal compounds can be combined by applying them as an intimate mixture to a suitable substrate in the form of a film on the substrate. Such application may be done by high vacuum evaporation, plasma coating, decomposition of organometallics, laser ablation coating or other known coating methods.

Figure 4:
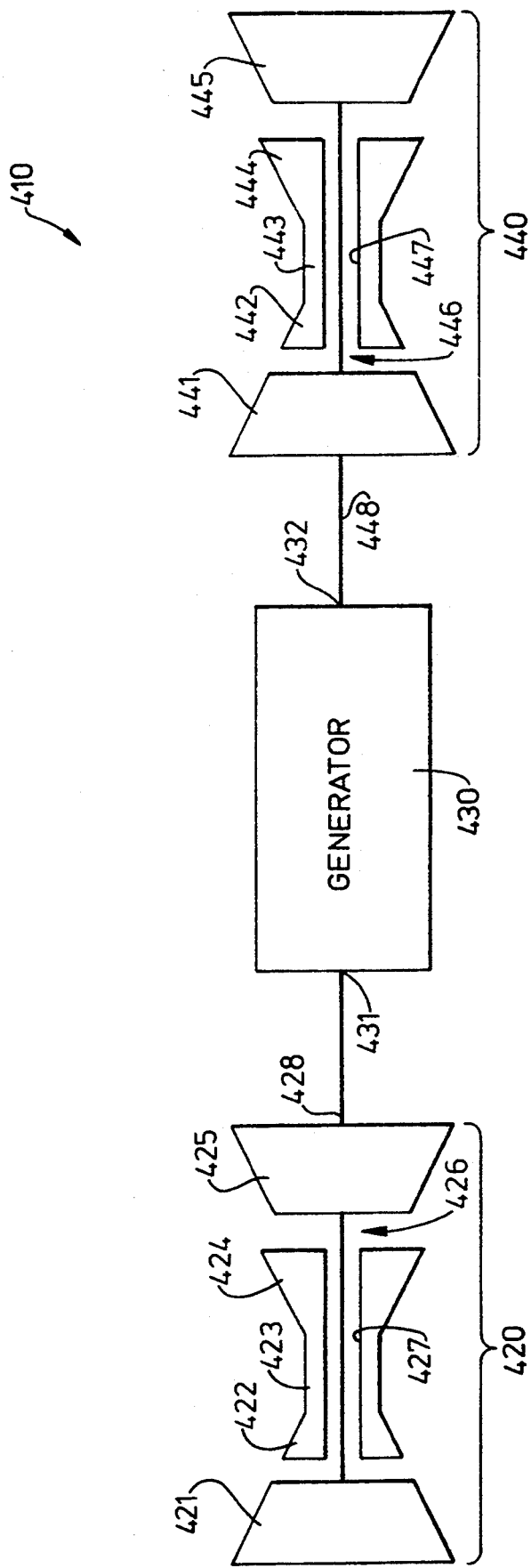
FIG. 4 is a phase diagram of the 1-2-4, 1-2-3, 2-4-7 system for Dy-Ba-Cu-O.

As another alternative specifically involving formation of the 1-2-4 compound which is used as an example herein, a substrate including the 1-2-3 compound or another compound containing one or more of the constituent metals of the 1-2-4 compound may be heated in concentrated or high pressure oxygen and thereby converted to the 1-2-4 compound or may be treated at pressures and temperatures such that 1-2-3 is not the stable phase as shown in FIG. 4. If all of the constituents of the 1-2-4 compound are incorporated in the substrate, a superconducting film may be formed without film deposition.

The supply of oxygen at a high oxidizing potential in the practice of the present invention may be achieved in a variety of ways. Molecular oxygen at hyperbaric pressure, or preferably appropriate combinations of temperature and pressure as indicated in FIG. 4 may be used. Ozone and atomic oxygen may be used in the alternative.

Further means of supplying oxygen at high oxidizing potential are the use of oxygen incorporated in a highly oxidized chemical compound which under appropriate conditions will release the oxygen, thus making it available for the formation of a second highly oxidized compound which is a superconductor. Such oxygen-supplying compounds include, but are not limited to, peroxides or nitrates of the constituent metals, as well as other highly oxidized compounds which may themselves be superconductors. To form the desired product, these oxygen-supplying compounds are placed in contact, and preferably mixed intimately, with the other constituent materials.

Still further means of supplying oxygen at high oxidizing potential are those involving the use of electrical current. Such means may for example involve placing the constituent starting materials in an electro-chemical cell containing an electrolyte which releases oxygen when exposed to an electric current. One example of such an electrolyte is $ZrO_2$. This method and that of the preceding paragraph may reduce or eliminate the need for elevated temperature during synthesis of the superconductor.

In preferred embodiments of the invention, the high oxidizing potential oxygen supply is molecular oxygen, ozone, or atomic oxygen, either alone or combined with each other or with inert gases. Molecular oxygen is preferred. When molecular oxygen is used, the gas mixture is preferably at least about 50% molecular oxygen, more preferably at least about 90% oxygen, and most preferably substantially 100% molecular oxygen. With molecular oxygen, the pressure is higher than the boundary region of 1-2-4 at a given temperature. Pressures less than 200 bar may readily be used through the use of temperatures below about 1050° C.

The temperature and heating time may vary, depending on the materials used. Higher temperatures will generally require less heating time. In preferred embodiments, the heating is done at a temperature of at least about 700° C. for at least 10 hours, or at least about 800° to 850° C. for about 1 hour. If the material is finely divided, lower temperatures (e.g., 600° to 700° C.) may be used.

Since superconducting phases of a highly oxidized state are formed herein, many new materials having superconducting capabilities, particularly with high superconducting transition temperatures, may be formed. It is thus expected that many new superconductors will be discovered by virtue of and through the practice of the methods disclosed herein.

Also by virtue of the methods disclosed herein, 1-2-4 materials can be reacted and/or sintered at significantly higher temperatures than 1-2-3 materials, without loss of phase identity. This is useful in the densification of the materials for enhancement of the superconducting current density $J_c$. Similar procedures may be applied to 1-2-3 by appropriate selection of temperature and pressure to suppress decomposition of 1-2-3. A preferred method of densification is hot isostatic pressing (HIP), a procedure known in the art. Upon applying the HIP technique to single-phase 1-2-4 materials, any initial conversion of the 1-2-4 to the 1-2-3 phase will terminate at an early stage once the internal oxygen pressure reaches about 5 to 30 bar at temperatures of 950° to 850° C.

B. Formation of Non-Superconducting Phase

According to one embodiment of the invention, oxidized superconductor or non-superconductor materials, of which the above-described materials are used herein as examples, are further treated to provide improved flux pinning characteristics. In one embodiment, an oxidized material is heated at a temperature and a pressure which permits diffusion and removal of oxygen in the material, but which does not permit rapid diffusion of an excess second superconducting or non-superconducting phase to grain boundaries. In one embodiment, 1-2-4 is heated at a temperature of between about 400° and 1000° C. and in an oxygen-containing atmosphere at a $P(O_2)$ of between about 0.0001 atm and 100 atm to destabilize the 1-2-4 to form 1-2-3. In preferred embodiments, referring to FIG. 4, the 1-2-4 is heated to a temperature and at a pressure in which 1-2-3 becomes the equilibrium phase. Pressure and temperature conditions which provide 1-2-3 with an oxygen content of below about 6.5 and preferably above about 6.1 in the formula $YBa_2Cu_3O_x$ are most preferred. The pressure and temperature conditions that produce a given oxygen content in 1-2-3/1-2-4 have been estimated by Lindemer et al., "Review of Non-Stoichiometry in $YBa_2Cu_3O_{7-x}$," Chemical Tech. Div., Oak Ridge Laboratory, TM-10827, November 1988, which is incorporated herein by reference. For example, the following equation may be used to estimate x (oxygen stoichiometry) for a given $P(O_2)$ and temperature:

$$\ln(P(O_2)) = \frac{\Delta H°_{rxn}}{RT} - \frac{\Delta S°_{(O2)}}{R}$$

where:

$\Delta H°_{rxn}$ = −160,700 (orthorhombic)
          −146,300 (tetragonal)

$\Delta S°_{(O2)}$ is selected from the following values:

| x | $\Delta S°_{(O2)}$ |
|---|---|
| 6.7 | −159.6 |
| 6.6 | −146.6 |
| 6.5 | −135.9 |
| 6.4 | −126.3 |
| 6.3 | −116.7 |
| 6.2 | −105.9 |
| 6.1 | −91.0 |

R is the gas constant
T is temperature (K).

When 1-2-3 is used as a starting material, the $P(O_2)$ and temperature can be selected to provide decomposition of 1-2-3 according to, for example, the data shown in Bormann et al., Appl. Phys. Lett., Vol. 54 (21), May 22, 1989, which has previously been incorporated herein by reference. The equation of the line for 1-2-3 stability is about:

$$\log_{10}(P(O_2)) = 10.18 - 1.41 \times 10^4 / T(° K.)$$

For a given T, the pressure should be maintained below the $P(O_2)$ given by the above equation.

FIG. 14 illustrates the decomposition line of 1-2-3 described by the above equation. The step of heating the superconductor results in an intermediate material with a first superconducting or non-superconducting phase plus a relatively immobile second phase.

Heating of the superconductor is optionally followed by a step of heating the intermediate material at a temperature and pressure which permits slight diffusion of the excess second and/or third phase, so as to allow for control of the size and distribution of the resulting pinning centers.

The optional heating step is preferably limited such that significant amounts of non-superconducting material (e.g., copper oxide) do not diffuse to grain boundaries of the superconductor, which would be detrimental to performance of the material. The optional step of heating is preferably performed until just before a significant decrease in critical current is caused due to the existence of the non-superconducting phase at the grain boundaries of the superconductor. Alternatively, the optional heating step is performed until the pinning energy of the material is on the order of a few electron volts such that thermally activated flux creep becomes negligibly small. The optional heating step may be carried out at, for example, a temperature of between about 0° and 500° C. higher than the initial conversion within a preferred range of about 50° to 150° C. higher for a few minutes up to several hours. The pressure may be preferably below the pressure at which the starting material is stable at the temperature chosen (e.g., atmospheric may be convenient).

C. Formation of Nucleation Regions

In the preparation of 1-2-3, 1-2-4, or other superconducting materials, non-superconducting materials are formed. The method may also be supplemented by the step of forming nucleation centers in the superconductor so as to better form non-superconducting regions. The nucleation centers may be formed by one of a variety of methods and serve to improve formation of regions of non-superconducting phases of a very small size. Such methods may include, for example, electron irradiation, ion irradiation, neutron irradiation, gamma irradiation, x-ray irradiation, or the like, so as to provide point defects in the crystal which significantly reduce nucleation energy for the formation of a non-superconducting phase. The pinning centers are optimally arranged along more or less straight lines. This can be accomplished for example by the use of charged particle irradiation such as electrons, $H^+$, $He^{++}$, $H^-$, $He^+$, or other negative ions, etc., which would deposit energy and displace atoms of the superconductor each of which can act as a nucleation center along the track of the charged particle through the superconductor.

The irradiation step is preferably carried out with electron or proton (hydrogen ion) irradiation at an energy of between 25 KeV and 100 MeV, depending upon the thickness of the material. The step is preferably carried out before heating the material for removal of oxygen and formation of the non-superconducting phase.

In alternative embodiments, the nucleation centers are formed by the addition of metals or metal oxides or compounds that produce metal oxides which are of limited solubility and whose solubility depends on temperature, pressure, or oxygen concentration in the formation of the starting materials.

D. Re-Diffusion of Oxygen

The intermediate product is, thereafter, treated under temperature and pressure conditions which re-diffuse or implant or otherwise re-introduce oxygen into the intermediate product to produce a material which is more fully oxidized with good superconducting properties. The step of re-introducing oxygen is conducted in some embodiments by diffusion at a temperature of between about 200° and 750° C. and in an oxygen-containing atmosphere at a $P(O_2)$ of between about 0.0001 atm and 200 atm. In preferred embodiments the step of re-diffusing oxygen is carried out at a temperature of between about 350° and 450° C. and at a pressure of between about 0.1 and 10 atm. In most preferred embodiments the step of re-diffusing oxygen is carried out a temperature of about 400° C. and at a pressure of about 1 atm. In some embodiments, the step of re-diffusing oxygen is carried out for between about 0.1 and 1000 hours. In preferred embodiments, the step of re-diffusing oxygen is carried out for between about 1 and 100 hours with a most preferred embodiment of about 10 hours.

The following examples are offered primarily for purposes of illustration, and are intended neither to limit nor define the invention in any manner.

IV. Example 1—Conversion of 1-2-4 into 1-2-3 with Flux Pinning Centers

A. Synthesis of 1-2-4

Polycrystalline materials bearing the empirical formula $R_1Ba_2Cu_4O_x$ where R is Y, Nd, Sm, Eu, Gd, Dy, Ho, Er, and Tm may be prepared as follows. Stoichiometric quantities of R oxide, BaO, and CuO powders (all 99% or better) may be mixed thoroughly and pressed at 25 kg/mm$^2$ into 6 mm diameter pellets, which may be calcined in oxygen held at 120 atmospheres pressure for 7 hours at 930° C. The reacted mixtures may then be cooled at 5° C. per minute to 700° C., 2° C./min to 600° C., 1° C./min to 500° C., 0.5° C./min to 450° C., 1° C./min to 390° C., and furnace cooled at about 4° C./min. The mixtures may then be finely ground with an agate mortar and pestle, pressed into 6-mm-diameter tablets at 25 kg/mm$^2$, and sintered in oxygen at the same temperature, pressure and time schedule as used for the calcining. In the case of the Ho, Er and Tm compounds, the calcining and sintering may both be carried out at 60 atmospheres pressure at a maximum temperature of 980° C. Cooling rates may be the same as described above. The pellets may be wrapped in gold foil before the calcining and sintering operations are carried out; no reaction with the gold should be observed. If the constituent oxides are mixed in the 1-2-3 stoichiometry instead of the 1-2-4 stoichiometry and then the process given in the first example herein is carried out, the result should be the formation of the desired 1-2-4 compound along with residual phases which incorporate the excess Y and Ba oxides which are left over.

Table 1 illustrates the properties of various superconductors which have been synthesized according to the above method and which are exemplary of the materials which may be used according to further aspects of the invention. In the table, the superconducting temperature $T_c$ was determined by observation of bulk diamagnetism. Note that the $T_c$'s of the different compounds are significantly different, and are correlated with lattice parameters a and b, and with orthorhombic distortion which is larger for the heavier (smaller) rare earth ions. The symbol $\chi_{20K}$ represents the flux expulsion on cooling to 20 K. in a constant Oe field, and is expressed in units of $10^{-4}$ emu/g. The symbol $4\pi\rho\chi_{20K}$ represents the diamagnetic volume fraction. The density $\rho$ is calculated from the measured unit cell volume. The superconducting fraction may be larger, because some expelled flux will be trapped in the pores of these ceramic samples. The relative amounts of the phases were estimated from x-ray powder diffraction patterns and Reitveld refinements. To determine the lattice parameters, the Reitveld procedure was used and a sample displacement correction was refined along with the unit-cell parameters. The refinement included 1-2-3 or 2-4-7 phases when present. The unit-cell parameters found for the Dy compound did not differ significantly from those determined using a $Cr_2O_3$ internal standard.

TABLE 1

| SUPERCONDUCTING AND STRUCTURAL PARAMETERS OF $RBa_2Cu_4O_8$ COMPOUNDS | | | | | | | | | | |
|---|---|---|---|---|---|---|---|---|---|---|
| | Superconducting Parameters | | | Phases Present | | | Lattice Parameters of 1-2-4 [2-4-7] Phase | | | |
| R | $T_c$(K) | $\chi_{20K}$ | $4\pi\rho\chi_{20K}$ | 1-2-3 | 2-4-7 | 1-2-4 | a (Å) | b (Å) | c (Å) | V (Å) | b/a |
| Y | 80.5 | −25 | 20% | no | no | all | 3.8395(2) | 3.8703(2) | 27.231(1) | 404.7 | 1.0080 |
| Nd | 57 | −3.5 | 3% | trace | no | minor | | | ~27.3 | | |
| Sm | 70 | −11 | 10% | 70% | no | 30% | 3.872(1) | 3.886(1) | 27.308(5) | 410.9 | 1.0036 |
| Eu | 68.5 | −24 | 21% | no | 40% | 60% | 3.8650(6) | 3.8837(5) | 27.279(4) | 409.5 | 1.0048 |
| | [~40] | [−10] | [9%] | | | | [3.879(2)] | [3.886(1)] | [50.39(3)] | [759.6] | [1.0018] |
| Gd | 73 | −18 | 16% | no | 60% | 40% | 3.867(1) | 3.881(1) | 27.26(1) | 409.1 | 1.0036 |
| | [~40] | [−9] | [8%] | | | | [3.868(2)] | [3.882(1)] | [50.43(2)] | [757.2] | [1.0036] |
| Dy | 77 | −19 | 17% | no | no | all | 3.8463(3) | 3.8726(3) | 27.237(1) | 405.7 | 1.0068 |
| Ho | 77 | −20 | 18% | no | no | all | 3.8404(6) | 3.8704(6) | 27.221(5) | 404.6 | 1.0078 |

TABLE 1-continued

SUPERCONDUCTING AND STRUCTURAL PARAMETERS OF $RBa_2Cu_4O_8$ COMPOUNDS

| | Superconducting Parameters | | | Phases Present | | | Lattice Parameters of 1-2-4 [2-4-7] Phase | | | | |
|---|---|---|---|---|---|---|---|---|---|---|---|
| R | $T_c(K)$ | $\chi_{20K}$ | $4\pi\rho\chi_{20K}$ | 1-2-3 | 2-4-7 | 1-2-4 | a (Å) | b (Å) | c (Å) | V (Å) | b/a |
| Er | 78 | −22 | 20% | no | no | all | 3.8366(5) | 3.8685(5) | 27.230(4) | 404.1 | 1.0083 |
| Tm | 77 | −11 | 10% | no | no | all | 3.827(1) | 3.864(1) | 27.18(1) | 401.9 | 1.0097 |

B. Formation of Flux Pinning Centers in 1-2-3 from 1-2-4

According to one embodiment of the invention, an oxidized superconducting material selected from the above materials or other highly oxidized materials may be heated to a temperature which facilitates removal and diffusion of oxygen, but which does not permit significant diffusion of an associated second phase to grain boundaries.

When using the 1-2-4 material as a starting compound, a wide variety of pressure and temperature conditions may be selected for use. FIG. 4 illustrates the stability of the Dy-Ba-Cu-O system as an example. To form materials according to one aspect of the invention, one would begin with 1-2-4 and subject it to temperature and partial pressures of oxygen which cause the 1-2-4 phase to at least partially convert to form the 1-2-3 phase. As shown in FIG. 4, pressure and temperature conditions which provide materials having an oxygen content of about 6.6 or less will be desirable. Pressure and temperature conditions which form materials having an oxygen content of below about 6.5 would be desirable with oxygen contents below 6.3 preferred, so long as 1-2-3 is not decomposed. As a general rule, pressures between about 0.1 and 300 bar will be used. Increasing temperature will have the effect of driving the material to the 1-2-3 phase, but increasing temperature will only be desirable within limits. At any given temperature lower pressure will be desirable. At elevated temperatures (e.g., above about 800° C.), diffusion of the non-superconducting phase becomes excessive. Lower pressures will tend to be desirable because the driving force of the reaction will be higher. Again, however, this will not be without limit because the 1-2-3 phase will become unstable at lower pressures (e.g., less than about 0.1 bar at 970° C. to 0.001 bar at 800° C.). Synthesis in a range of the diagram where the equilibrium oxygen content of the 1-2-3 is about 6.1 to 6.2 is most desirable. For example, $10^{-3}$ to $10^{-2}$ bar at 700° C. and $10^{-4}$ bar at 600° C. may be used.

The optional heating step may, thereafter, be followed by treatment at a higher temperature of about 800° C. in an oxygen environment having a $P(O_2)$ of about 0.1 atm. The intermediate 1-2-3 phase is then re-oxidized for a period of about 10 hours at 400° C. to again form a superconducting phase. Copper-rich non-superconducting inclusions will be trapped inside the grain boundaries of 1-2-3. It is believed that the presence of such inclusions will increase the critical current of the superconductor by 50 to 200% or more over that of the 1-2-4 material alone. It is further believed that the inclusions will provide critical currents of between about 50 to 200% or greater than 1-2-3 material alone.

C. Formation of Flux Pinning Centers in 1-2-3

When 1-2-3 is the starting material and it is desirable to precipitate other phases, it will be desirable to treat the 1-2-3 under temperature and oxygen partial pressure conditions which render the 1-2-3 unstable. Synthesis of 1-2-3 itself is well known. When the equilibrium oxygen content of the 1-2-3 is lowered to below about 6.1, it will tend to become unstable. Lower pressure (e.g., below about $10^{-3}$ bar at 800° C. or $10^{-5}$ bar at 700° C. or $10^{-7}$ bar at 600° C.) will be desirable within limits such as those imposed by mechanical constraints of vacuum pumps, diffusion rates of $O_2$, and the like. High temperatures will also tend to be desirable to increase the driving force of the reaction, but again, excess diffusion of the non-superconducting phase should be avoided.

While the invention is illustrated above with regard to the reaction control by way of reduced oxygen partial pressure, it should be recognized that reducing agents could be effectively utilized to produce the same effect. Such reducing materials would include, for example, hydrogen, carbon monoxide, ammonia, methane, hydrogen sulfide, borane, phosphine, arsine, or the like as well as elemental reducing agents that may be incorporated into the final composition, e.g. La, Y, K, Rb, Ba, etc.

V. Example 2—Synthesis of Y-Ba-Cu-O and Dy-Ba-Cu-O Interspersed by Non-Superconductor A series of two experiments were carried out. In the first series, the starting stoichiometry was varied over a wide range while $P(O_2)$, temperature and time were held constant. In the second series, the oxygen pressure in which the solid state reaction took place was varied in small steps. Temperature and time were held constant and starting stoichiometries were 1:2:3, 1:2:4 and 1:2:3.5. The superconducting phases present in the products of all three series of experiments were identified by XRD, and bulk superconductivity was confirmed and $T_c$ determined by measurement of Meissner diamagnetism in a SQUID magnetometer.

Samples were prepared by solid state reaction of $Y_2O_3$ or a rare earth oxide $R_2O_3$ (R=Nd, Sm, Eu, Gd, Er, Dy, Ho, Er, or Tm) (all 99.9%), with BaO (99.99%) and CuO (99.99%). All ingredients were fine powders (~325 mesh), which were ground together in a mortar and pestle and pressed into 6 mm tablets at 3500 kg/cm$_2$. The samples were wrapped individually in Au foil and calcined for 8 hours in high pressure $O_2$ in a commercially available externally heated high pressure oxygen furnace. Calcining was followed by slow cooling to room temperature. To maximize homogeneity, each sample was then re-ground, pressed, fired and cooled a second time under the same conditions.

In the first series of experiments, conducted at $P(O_2)=100$ bar and synthesis temperature of 930° C., the starting cation ratio was varied over a wide range, but only the 124 phase formed (see FIG. 1). With Y:Ba:Cu ratios of 1:2:3, 1:2:3.5, 1:2:4, and 1:2:5, the 124 phase alone, without 123 or 247, was detected by low-angle XRD (described below). At still greater CuO content (1:2:6), and in samples richer in Ba (Y:Ba:Cu ratios 1:3:4, 1:3:5, 1:3:6), or rich in yttrium (1:1:2), no low angle peaks appeared. These experiments indicate that 124 is the stable phase in high $P(O_2)$ over a considerable range of starting compositions.

In the second series of experiments, starting stoichiometries (cation ratios) of 1:2:3, 1:2:3.5 and 1:2:4 were used. Experiments were conducted on the Dy-Ba-Cu-O system as well as on Y-Ba-Cu-O. Samples were processed at a series of closely spaced pressures between 9 and 47 bar (1 bar=0.1 Mpa=0.987 atm). The temperature was 930° C.

Figure 2:
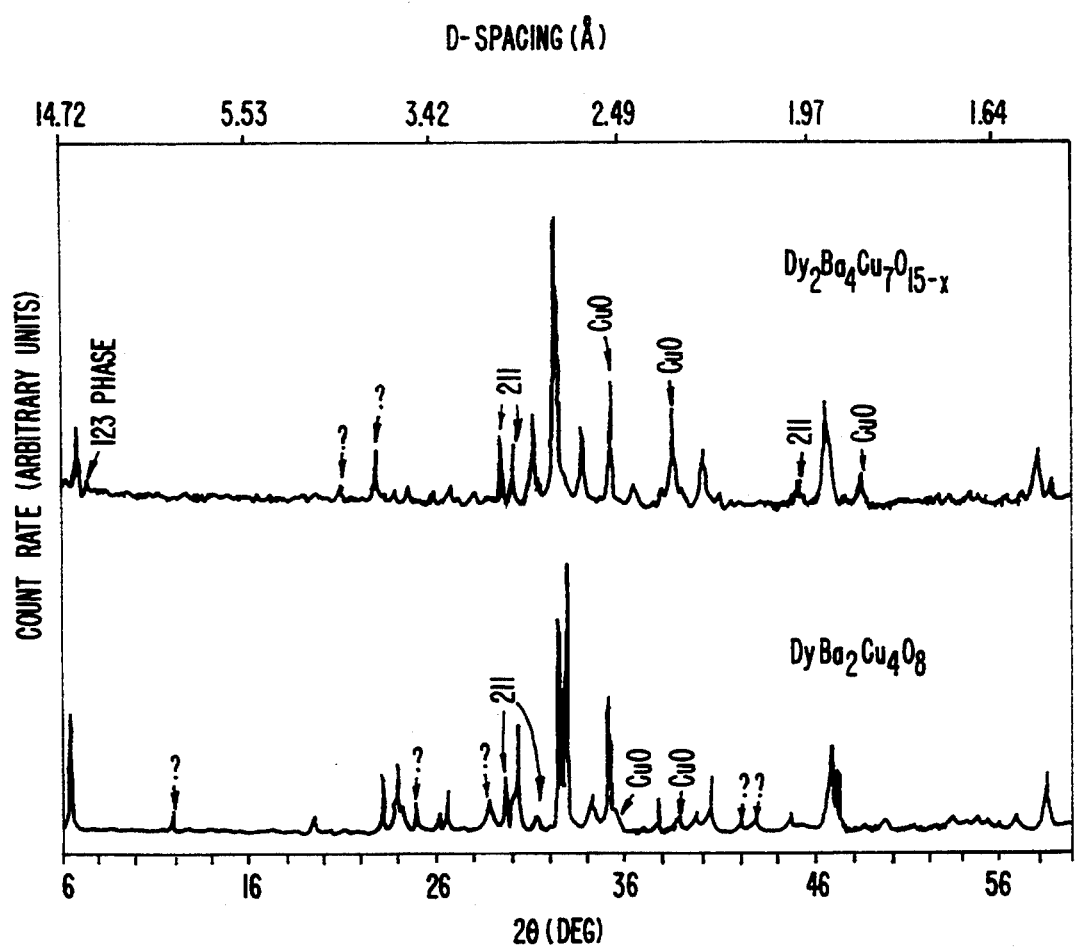
FIG. 2 shows x-ray powder diffraction patterns for the 124 and 247 phases in the Dy-Ba-Cu-O system. Each pattern shows a single phase, except for additional peaks identified as CuO and $Y_2Ba_1Cu_1O_5$.

The reacted samples were examined by x-ray powder diffraction (XRD). The count rate patterns in FIG. 2 indicated that in addition to one or more of the superconducting phases, most samples contained some CuO and BaO, as indicated by the peaks at 29.8 and 45.5 degrees, as well as small quantities of the 211 "green phase" $R_2BaCuO_5$. The three superconducting phases were distinguished by their characteristic low-angle powder diffraction peaks as shown in the upper portion of FIG. 3. The [0 0 2] peak of the 124 phase is found at d spacing $\approx 13.6$ Å, clearly distinct from the position of the [0 0 1] peak of 123 at 11.7 Å and the [0 0 4] peak of 247 at 12.55 Å. The 2-4-7 peak is significantly broadened. This method is quite sensitive when applied to the Dy-Ba-Cu-O system, because the low-angle reflections from the rare earth compounds are quite strong, as shown in FIG. 2.

Figure 3:
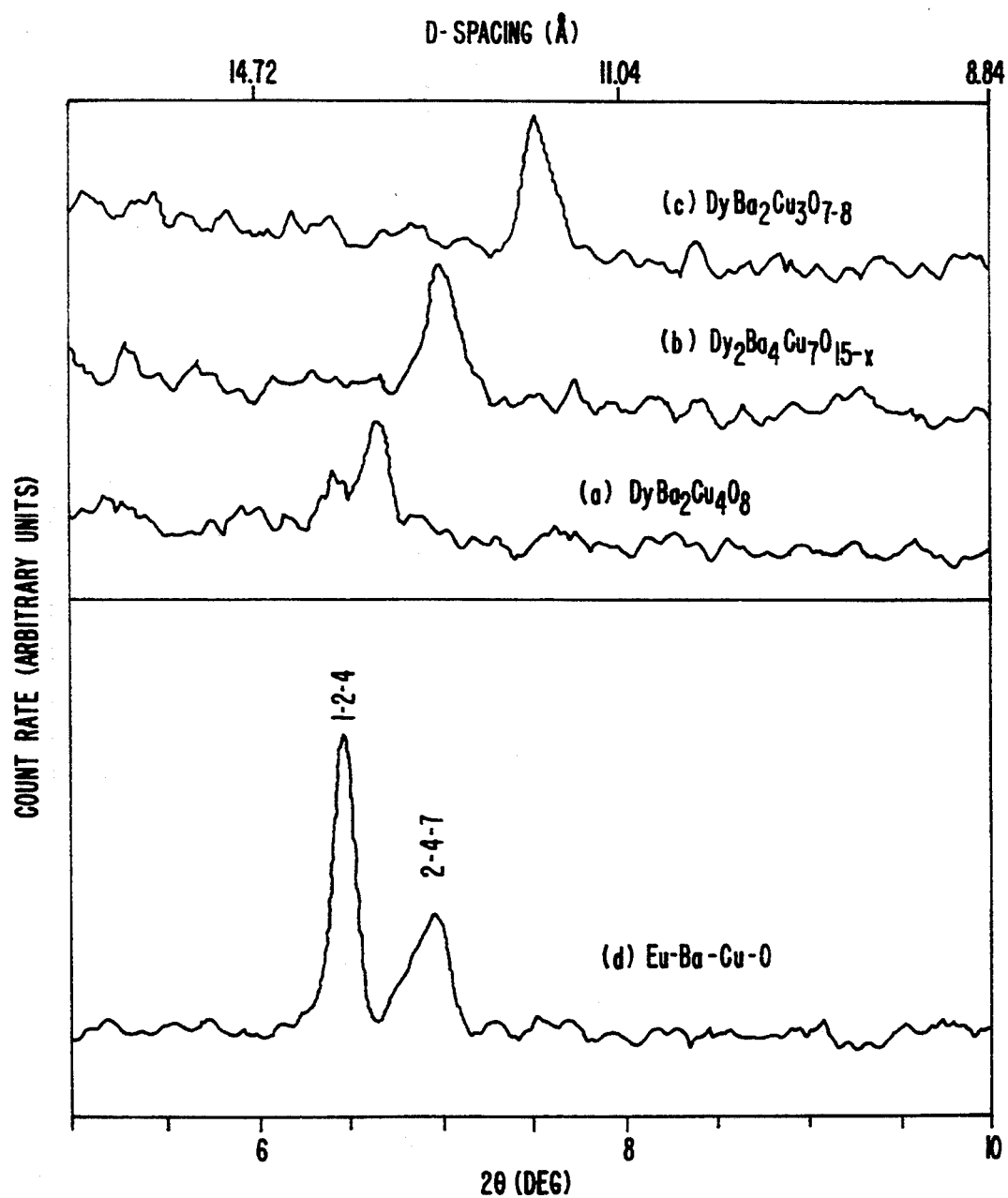
FIG. 3 shows low angle x-ray powder diffraction curves taken with Cu $k_\alpha$ radiation: (a) Dy-Ba-Cu-O synthesized at 930° C. in 35 bar $O_2$; the peak at d spacing=3.6 Å indicates the 124 phase. (b) Dy-Ba-Cu-O synthesized in 17 bar $O_2$; the peak at 12.55 Å indicates the 247 phase. (c) Dy-Ba-Cu-O synthesized in 6 bar $O_2$; the peak at 11.7 Å indicates the 123 phase. (d) Eu-Ba-Cu-O processed in 100 bar $O_2$. The two peaks at 13.6 Å and 12.55 Å indicated that the sample contains both 124 and 247 phases.

FIG. 13 is a TEM of Eu-Ba-Cu-O illustrated in Table 1 and with the low angle diffraction pattern shown in the lower portion of FIG. 3. Note that the 2-4-7 peak in FIG. 3 is substantially broadened, indicating 2-4-7. This is shown directly in the TEM. The TEM shows many interspersed regions of the 2-4-7 and 1-2-4 materials. Above the $T_c$ of 2-4-7, the 2-4-7 will act as flux pinning centers. In any event, the boundaries will also act as pinning centers.

VI. Example 3—Partial Conversion of 1-2-4 to 1-2-3 Plus A Non-Superconducting Phase In order to further test the invention, a variety of samples were prepared using $YBa_2Cu_4O_8$ as a starting material.

The first series of experiments utilized three samples, which are elsewhere referred to herein as A, B, and C. Sample A was 1-2-4 material which has been discussed at length above. Sample B was 1-2-4 treated at 775° C. for 160 hours in 1 atm of $O_2$. Sample C was treated at 930° C. for 5 hours in 1 atm $O_2$. All samples were cooled to room temperature during which time, re-oxidation of 1-2-3 occurred.

Susceptibility curves for samples A, B, and C are provided in FIG. 5. As would be expected, the 1-2-4 sample begins to show negative susceptibility at about 80K., indicating superconductivity, and shows a rapid drop in susceptibility, indicating a relatively pure sample. Sample B shows a stepped falloff starting 92K. indicating the presence of finely divided superconducting 1-2-3 phase within the crystals and a large falloff at 80K. indicating a large fraction of 1-2-4. Sample C shows a negative susceptibility starting at about 95K., which is more closely correlated with the $T_c$ of 1-2-3 and a gradual falloff in susceptibility, indicating finely divided regions with differing Tc's, i.e. 1-2-4 and 1-2-3. At a temperature of about 70K., the susceptibility is smaller than its maximum value, indicating non-superconducting regions are present at that temperature. These regions should act as pinning centers. It should be noted that the $T_c$ of sample C is, however, significantly higher than the value normally reported for 1-2-3 or 1-2-4. For reasons which are not entirely understood to the inventor herein, the presence of finely divided multiple phases or intergrowths in the superconductor will, in addition to increasing critical current, provide a $T_c$ above that of either phase alone.

FIG. 6 provides an atomic resolution TEM of sample B. The distance indicated by "1" is 11.6 Å. The distance indicated by "2" is 13.6 Å. The distance indicated by "3" is 25.7 Å. 13.6 Å is the C axis unit cell spacing of the 1-2-4 phase while 11.6 Å is the C axis unit cell spacing of the 1-2-3 phase. This TEM illustrates the presence of 1-2-4 in contact with 1-2-3 within a crystal.

FIG. 7 shows another region in sample B. In the upper right-hand portion of the figure, a partial dislocation is shown, i.e., a region where 1-2-3 and 1-2-4 meet. The extra copper layer which distinguishes 1-2-4 from 1-2-3 ends at the interface. Therefore, copper oxide has likely been removed in this region, and gone upward extending along a line perpendicular to the plane of the figure, leaving the boundary between the 1-2-4 and 1-2-3. This dislocation should act as an effective pinning center extending along the line. Note that the strain field extends about 10 to 15 Å around the defect in the plane of the figure.

Similar meeting points of layers of differing thickness are observed throughout FIG. 7. Note that strain fields around the dislocations are produced throughout the area due to the dislocations. The dislocations and regions within these strain fields should also act as effective pinning centers.

On the left-hand portion of FIG. 7, a "checkerboard" meeting point is found, i.e., a region in which, in an imaginary square, 1-2-3 is found in the upper right- and lower left-hand portion of the "square" while 1-2-4 is found in the lower right- and upper left-hand portions of the square. The strain field produced in this region should also act as an effective pinning center.

FIG. 8 shows the weight-versus-temperature curve during preparation of sample C. The sample shows a weight loss as it is heated, particularly after it reaches about 900° C. where it was held for 5 hours. The sample eventually had about a 1.6% weight loss, corresponding to the loss of about ⅔ of an oxygen per formula unit. When the sample was cooled, the weight gain was slower because the temperature was lowered at a slow rate. This curve is typical of 1-2-3 which gains oxygen as it is cooled. The oxygen content of 1-2-3 is reversibly variable as a function of temperature. This confirms the formation of 1-2-3 from 1-2-4.

FIG. 9 shows the susceptibility curve for additional samples. Again, the curve for sample A (1-2-4) is shown for comparison. Sample D was 1-2-4 heated at 950° C. in 1 atm of $O_2$ for 5 hours, and cooled over 1.5 hours to ambient. Sample E was heated at 890° C. for 6 hours in 1 atm of $O_2$ and cooled to ambient over 6 hours. Sample F was heated at 775° C. for 140 hours in 1 atm $O_2$ and cooled to ambient over 1 hour. Sample G was heated at 775° C. for 100 hours in 0.0001 atm $O_2$ and cooled to ambient over 6 hours.

Based upon the susceptibility curves, sample D has clearly been converted to 1-2-3. The $T_c$ is, however, somewhat lower than observed with sample C. It is believed this occurs because only a single phase is present. The drop-off in susceptibility is also much sharper, indicating a nearly complete conversion to 1-2-3, as opposed to the somewhat less complete conversion obtained in samples B and C and, therefore, the gradual transition in susceptibility, indicating multiple superconducting phase and fine division of the two phases. Curve E shows a similar result. While it is believed that sample D would have improved flux pinning ability due to the formation of CuO within the crystal. The CuO may have reached the grain boundaries since the temperature was high, or at least may have agglomerated into larger regions than desired for efficient flux pinning. The retention of at least some 1-2-4, as shown in samples B may produce better results due to the presence of multiple superconducting phases within the crystal. By contrast, sample E shows only a minimum amount of conversion to 1-2-3 and sample F nearly no conversion. By reducing $O_2$ pressure, in this case, to 0.0001 atm at 775° C., it is seen that conversion to 1-2-3 takes place and a more gradual transition in susceptibility beginning at 92K. is obtained, indicating the presence of finely divided 1-2-3.

FIG. 10 shows magnetic susceptibility curves for additional samples H, I, and J. Sample J (treated at 700° C. for 60 min in 1% $O_2$, cooled over 85 min to 100° C.) shows little conversion to 1-2-3, while samples H (1-2-4 treated at 800° C. for 100 min in 1% $O_2$, and cooled to 200° C. in 160 min) and I (1-2-4 treated at 850° C. for 60 min in 1% $O_2$, and cooled to 200° C. in 85 min) show the more gradual drop-off in susceptibility characteristic of substantially mixed 1-2-4, 1-2-3 phases. In general, it would be desirable to treat the materials under conditions such that the transition in susceptibility from one susceptibility level to the next as a function of temperature is broadened at least to about 5° C. and preferably at least 10° C.

FIGS. 11 and 12 provide weight loss curves for samples J and H, respectively. The susceptibility curve of FIG. 10 shows sample J to be largely 1-2-4, the weight loss curve of FIG. 11 shows that, in fact, a measurable conversion to 1-2-3 has occurred since some weight gain takes place on cooling.

VII. Use of Materials Disclosed Herein

Without in any way limiting the scope of the invention it is believed that the invention may frequently provide defects in the form of flakes, or generally planar structures, which extend along lines or planes rather than simply points. Hence, magnetic flux lines or planes are pinned along a more reasonable distance. Accordingly, improved results in use of a superconductor synthesized according to the invention may be obtained by using the material in an orientation in which magnetic fields are substantially parallel or, at a maximum within ±30 degrees or less of the planes of the defects. This will substantially increase pinning energy without substantially increasing resistance in the superconductor. The material is also preferably oriented such that the flow of current is along planes of the defects or, at a maximum within about ±30 degrees or less of the plane of the defects and substantially perpendicular to the lines of magnetic flux or, at a maximum, within about ±30 degrees or less of the perpendicular to the flux lines.

The foregoing is offered primarily for illustrative purposes. It will be readily apparent to those skilled in the art that substitutions, modifications and variations in the procedures and materials disclosed above may be made without departing from the spirit and scope of the invention.

What is claimed is:

1. A method of using a high temperature superconductor in a magnetic field, the high temperature superconductor comprising a material selected from the group of Re-Ba-Cu-O, Y-Ba-Cu-O, Bi-Sr-Ca-Cu-O, Ba-K-Bi-O, Tl-Ba-Ca-Cu-O, and combinations thereof, said high temperature superconductor formed by heating a starting material at a sufficient temperature and with a low enough oxygen partial pressure to cause localized areas within the starting material to become unstable and decompose into non-superconducting phases, wherein said temperature and oxygen partial pressure do not permit significant diffusion of said localized areas of non-superconducting phases to oxide superconductor grain boundaries, wherein said non-superconducting phase lies substantially along parallel crystallographic planes within the high temperature superconductor, the method comprising the step of orienting said superconductor in a magnetic field such that magnetic flux is substantially perpendicular to said parallel crystallographic planes of the non-superconducting phase, said high temperature superconductor having a higher critical current than said high temperature superconductor without said non-superconducting phase.

2. A method of precipitating a plurality of non-superconducting phase inclusions within a plurality of oxide superconductor grains, the method comprising the steps of:

selecting a starting material from the group of oxide superconductors consisting of $R_1Ba_2Ca_3O_x$, $R_1Ba_2Cu_4O_x$, $Bi_2Sr_2Ca_2Cu_3O_x$, and $Tl_2Ba_2CaCu_3O_x$, wherein R is selected from the group consisting of yittrium and rare earth metals;

heating the starting material at a sufficient temperature and with a low enough oxygen partial pressure to cause localized areas within the starting material to become unstable and decompose into non-superconducting phases, wherein said temperature and oxygen partial pressure do not permit significant diffusion of said localized areas of non-superconducting phases to oxide superconductor grain boundaries;

halting the decomposition before all of said starting material has decomposed; and reoxidizing the starting material, wherein a plurality of non-superconducting phase inclusions remain trapped within a plurality of oxide superconductor grains.

3. The method as recited in claim 2 wherein the step of halting the decomposition is directly followed by a second heating step at a temperature and a pressure so as to increase the size of said localized areas of non-superconducting phase.

4. The method as recited in claim 2 wherein said localized areas of non-superconducting phase have dimensions of between about 1 angstrom to 100 angstroms.

5. The method as recited in claim 2 wherein regions of non-superconducting phase are about 20 Å in a crystallographic plane of the material and about 2 Å perpendicular to said plane.

6. The method as recited in claim 2 wherein said regions of non-superconducting phase lie substantially along planes parallel to a.b planes of said oxide superconductor.

7. The method as recited in claim 6 further comprising the step of flowing current through said superconductor, said current flowing along a.b planes of said superconductor and substantially perpendicular to flux lines of a magnetic field in said superconductor.

8. The method of claim 2 wherein $YBa_2Cu_3O_x$ is selected as the starting material, said temperature during the heating step is between about 500° and 600° C. said oxygen partial pressure is between about $10^{-1}$ and $10^{-6}$ atmospheres, said non-superconducting phases are selected from the group consisting of $Y_2BaCuO_5$, $BaCuO_2$, $CuO$, and $Cu_2O$, and said reoxidizing step is performed at an oxygen pressure of 1 atmosphere.

9. The method of claim 2 wherein $Bi_2Sr_2Ca_2Cu_3O_x$ is selected as the starting material, said oxygen partial pressure is about $10^{-3}$ atmospheres, and said non-superconducting phases consist of $Bi_2SrCa_2Cu_2O_x$ and $CaCuO_2$.

10. The method of claim 3 wherein the temperature of the second heating step is between about 50° and about 150° C. higher than the temperature used in the first heating step and the pressure during the second heating step is 1 atmosphere.

11. The method of claim 2 wherein the step of reoxidizing the starting material is performed at a temperature of between about 200° and 750° C., in an oxygen containing atmosphere at a pressure of between about 0.0001 and 200 atmospheres, and for a period of between about 1 and 100 hours.

12. The method of claim 2 wherein the step of reoxidizing the starting material is performed at 400° C., in an oxygen containing atmosphere at a pressure of about 1 atmosphere, and for a period of 10 hours.

13. The method of claim 2 wherein the step of selecting a starting material is followed by the step of irradiating the starting material to form point defects, wherein a source for said irradiating step is selected from the group comprising electron, proton, ion, neutron, gamma and x-ray irradiation.

14. The method of claim 13 wherein the source is electron irradiation at an energy of between about 25 KeV and 100 MeV.

* * * * *

UNITED STATES PATENT AND TRADEMARK OFFICE
CERTIFICATE OF CORRECTION

PATENT NO. : 5,430,008
DATED : July 4, 1995
INVENTOR(S) : Morris

It is certified that error appears in the above-identified patent and that said Letters Patent is hereby corrected as shown below:

<u>In the drawing</u>:

The drawing sheet, consisting of Fig. 4, should be deleted to be replaced with the drawing sheet, consisting of Fig. 4, as shown on the attached page.

Signed and Sealed this

Third Day of November, 1998

*Attest:*

*Attesting Officer*

BRUCE LEHMAN
*Commissioner of Patents and Trademarks*

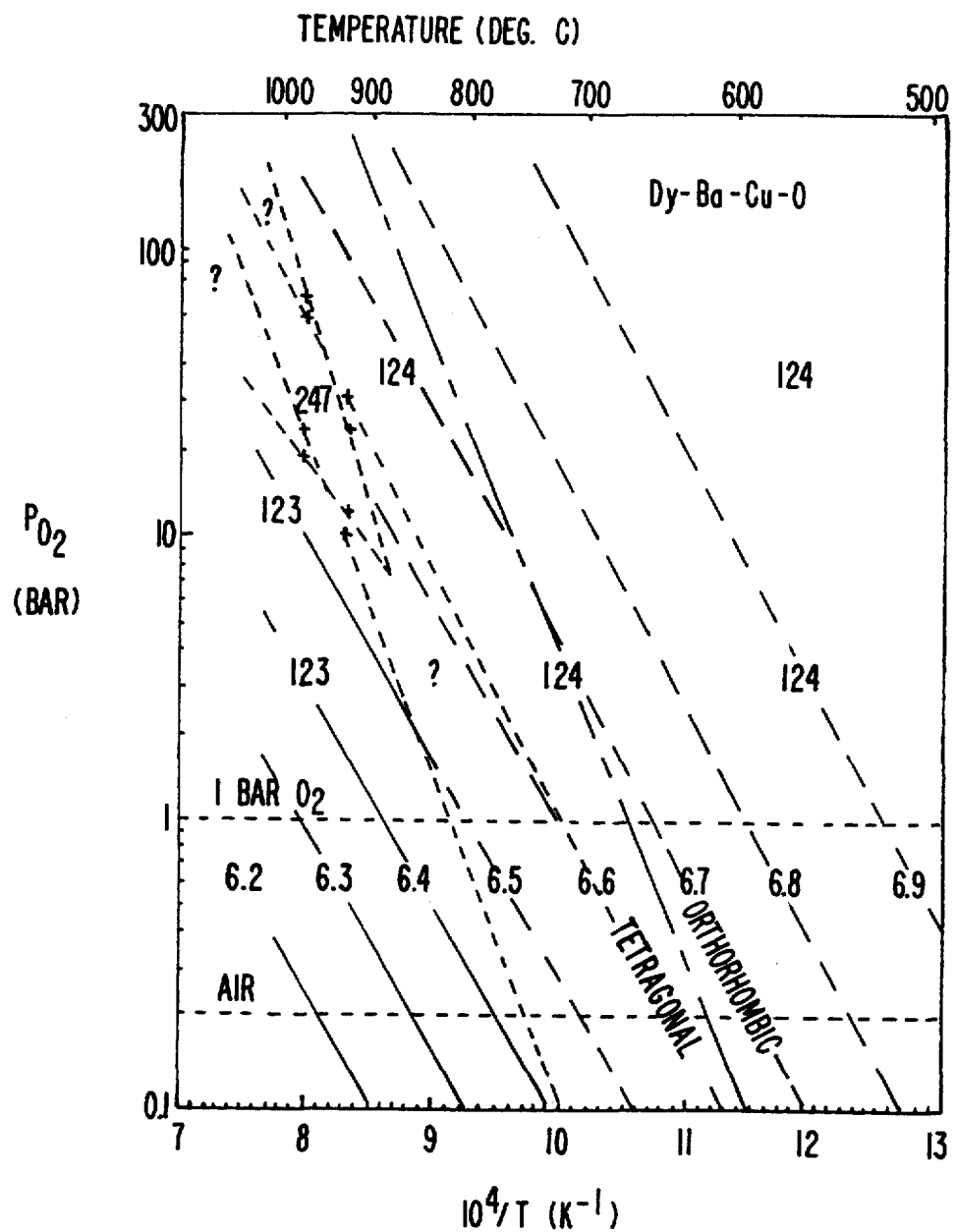
FIG._4.